United States Patent
Niimi et al.

(10) Patent No.: US 9,224,638 B2
(45) Date of Patent: Dec. 29, 2015

(54) INTEGRATED CIRCUITS WITH METAL-TITANIUM OXIDE CONTACTS AND FABRICATION METHODS

(71) Applicant: GLOBALFOUNDRIES Inc., Grand Cayman (KY)

(72) Inventors: Hiroaki Niimi, Cohoes, NY (US); Kisik Choi, Watervliet, NY (US); Hoon Kim, Clifton Park, NY (US); Andy Wei, Queensbury, NY (US); Guillaume Bouche, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/275,448

(22) Filed: May 12, 2014

(65) Prior Publication Data

US 2015/0325473 A1  Nov. 12, 2015

(51) Int. Cl.
*H01L 21/768* (2006.01)
*H01L 23/522* (2006.01)

(52) U.S. Cl.
CPC .... *H01L 21/76843* (2013.01); *H01L 21/76802* (2013.01); *H01L 23/5226* (2013.01)

(58) Field of Classification Search
CPC ............... H01L 21/76843; H01L 21/76802; H01L 23/5226
See application file for complete search history.

(56) References Cited

U.S. PATENT DOCUMENTS

2001/0051420 A1* 12/2001 Besser ............. H01L 21/76802
438/597

* cited by examiner

*Primary Examiner* — David Vu
(74) *Attorney, Agent, or Firm* — Heslin Rothenberg Farley & Mesiti P.C.

(57) ABSTRACT

Devices and methods for forming semiconductor devices with metal-titanium oxide contacts are provided. One intermediate semiconductor device includes, for instance: a substrate, at least one field-effect transistor disposed on the substrate, a first contact region positioned over at least a first portion of the at least one field-effect transistor between a spacer and an interlayer dielectric, and a second contact region positioned over at least a second portion of the at least one field-effect transistor between a spacer and an interlayer dielectric. One method includes, for instance: obtaining an intermediate semiconductor device and forming at least one contact on the intermediate semiconductor device.

15 Claims, 28 Drawing Sheets

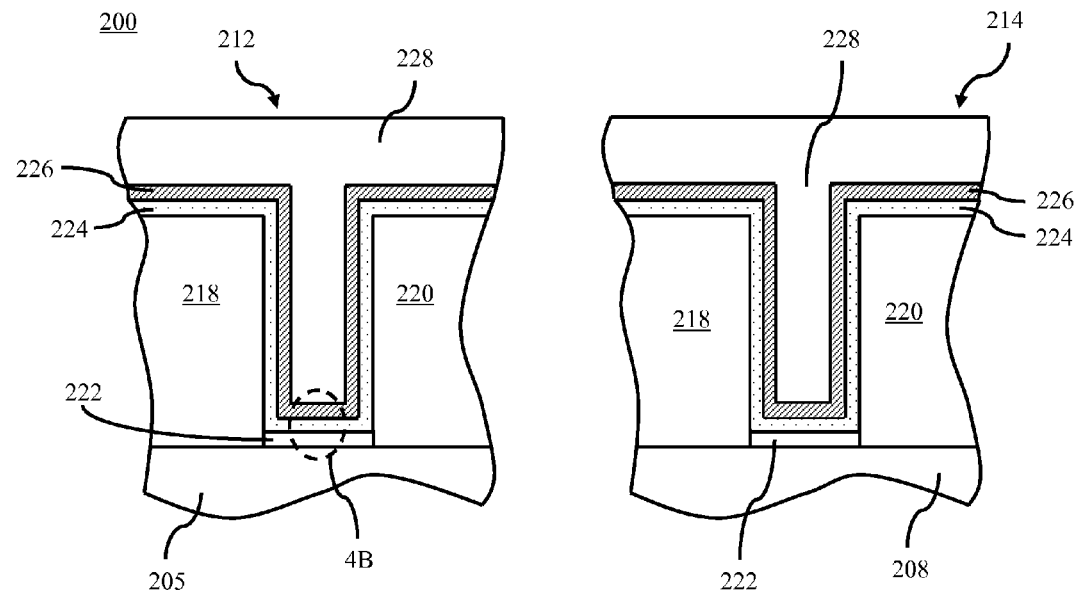
FIG. 4A
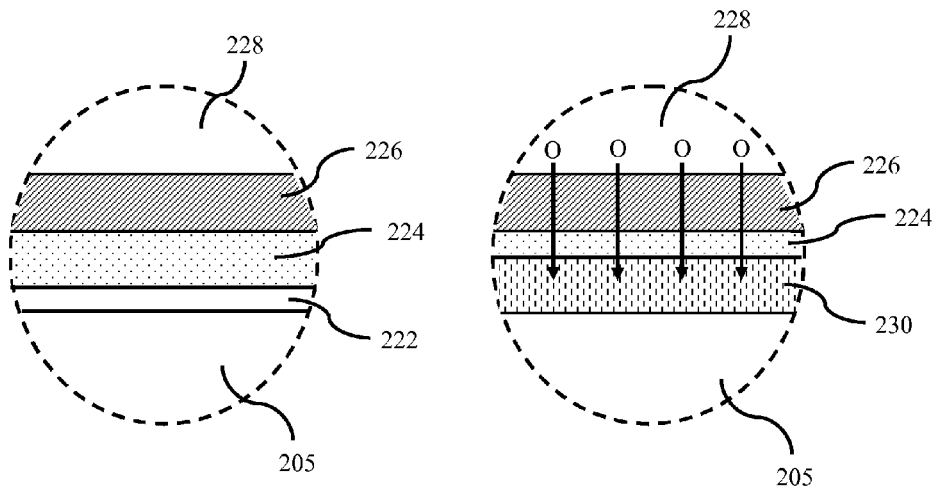
FIG. 4B                    FIG. 4C

INTEGRATED CIRCUITS WITH METAL-TITANIUM OXIDE CONTACTS AND FABRICATION METHODS

FIELD OF THE INVENTION

The present invention relates to semiconductor devices and methods of fabricating semiconductor devices, and more particularly, to integrated circuits with metal-titanium oxide contacts and fabrication methods.

BACKGROUND OF THE INVENTION

Semiconductor devices may be fabricated to have one or more different device characteristics, such as contact resistance, interface layer thickness, threshold voltage, leakage power consumption, etc. Multiple different designs may each allow for optimization of one or more of the semiconductor device characteristics to optimize performance of specific functions. For instance, a nickel silicide contact may have a low contact resistivity but may cause source/drain shorts and static random access memory (SRAM) yield loss. While titanium silicide contacts may have a relatively high contact resistivity so the defect of nickel silicide contacts isn't formed, but device performance is degraded due to the high contact resistivity. Thus, each characteristic of a semiconductor device must be optimized in order to obtain the desired semiconductor devices characteristics.

BRIEF SUMMARY

The shortcomings of the prior art are overcome and additional advantages are provided through the provision, in one aspect, a device is provided which includes, for instance: a substrate; at least one field-effect transistor disposed on the substrate; a first contact region positioned over at least a first portion of the at least one field-effect transistor between a spacer and an interlayer dielectric; and a second contact region positioned over at least a second portion of the at least one field-effect transistor between a spacer and an interlayer dielectric. The first contact region is provided which includes, for instance: at least one first opening positioned between the spacer and interlayer dielectric; a first layer on a bottom portion of the at least one first opening; at least one barrier layer over the first layer and two sides of the at least one first opening; a first metal layer over the at least one barrier layer; and a second metal layer over the first metal layer.

In another aspect, a method includes, for instance: obtaining an intermediate semiconductor device and forming at least one contact on the intermediate semiconductor device which includes, for instance: etching at least one opening in the intermediate semiconductor device; depositing a chemical oxide into the at least one opening; applying at least one barrier layer over the intermediate semiconductor device; depositing at least one dielectric layer over the barrier layer; and annealing the intermediate semiconductor device. The intermediate semiconductor device is provided which includes, for instance: a substrate; a dielectric layer over the substrate; at least one spacer over the substrate; and at least one field-effect transistor disposed on the substrate.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 4A depicts the structures of FIG. 3 after two dielectric layers are deposited, in accordance with one or more aspects of the present invention;

FIG. 4B depicts an enlarged portion of the layers of the structure of FIG. 4A, in accordance with one or more aspects of the present invention;

FIG. 4C depicts an enlarged portion of the layers of the structure of FIG. 5, in accordance with one or more aspects of the present invention;

FIG. 17 depicts the structures of FIG. 16 after etching at least one nFET contact opening and forming an oxide layer in the at least one nFET contact opening, in accordance with one or more aspects of the present invention;

FIG. 18 depicts the structures of FIG. 17 after depositing a barrier layer over the device, in accordance with one or more aspects of the present invention;

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, including conventional planar complementary metal-oxide semiconductors (CMOS) devices and field-effect transistors (FETs), which provide advantages over the above noted, existing semiconductor devices and fabrication processes. Advantageously, the integrated circuit device fabrication processes disclosed herein provide for CMOS and FET devices with lower minimum contact resistance and an increase in contact resistance with increasing interface.

Figure 1A:
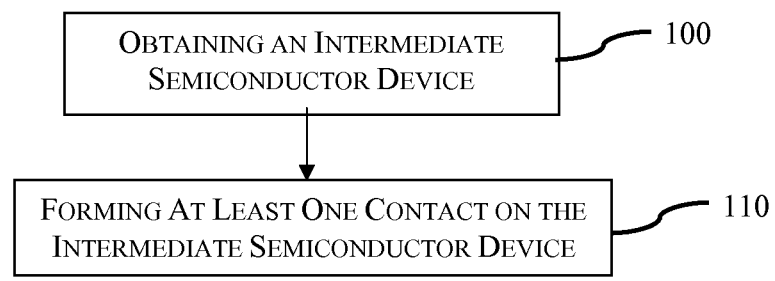
FIG. 1A depicts one embodiment of a method for forming semiconductor contacts, in accordance with one or more aspects of the present invention.

In one aspect, in one embodiment, as shown in FIG. 1A, integrated circuit device formation in accordance with one or more aspects of the present invention may include, for instance: obtaining an intermediate semiconductor device 100 and forming at least one contact on the intermediate semiconductor device 110.

Figure 1B:
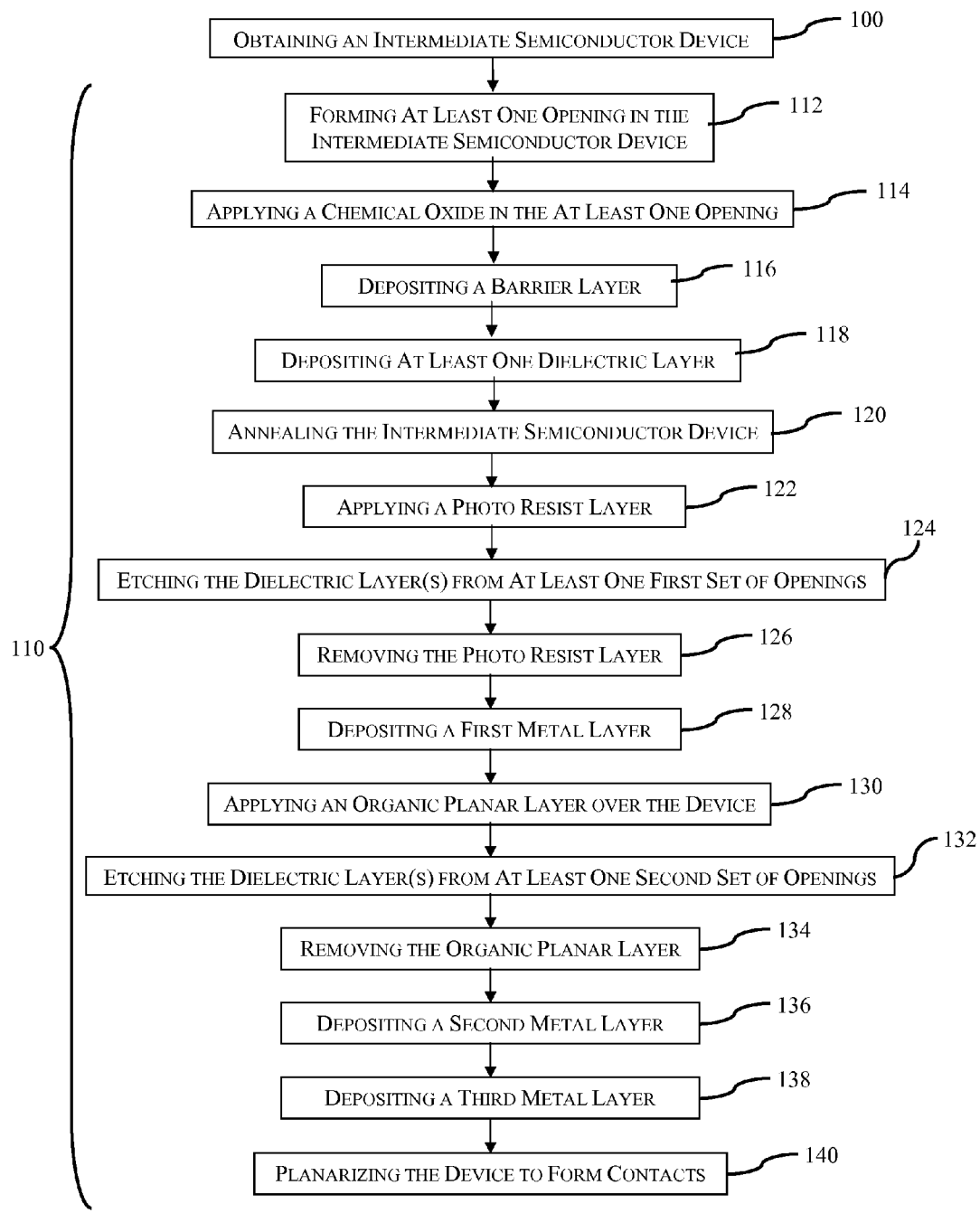
FIG. 1B depicts another embodiment of a method for forming semiconductor contacts, in accordance with one or more aspects of the present invention.
Figure 1C:
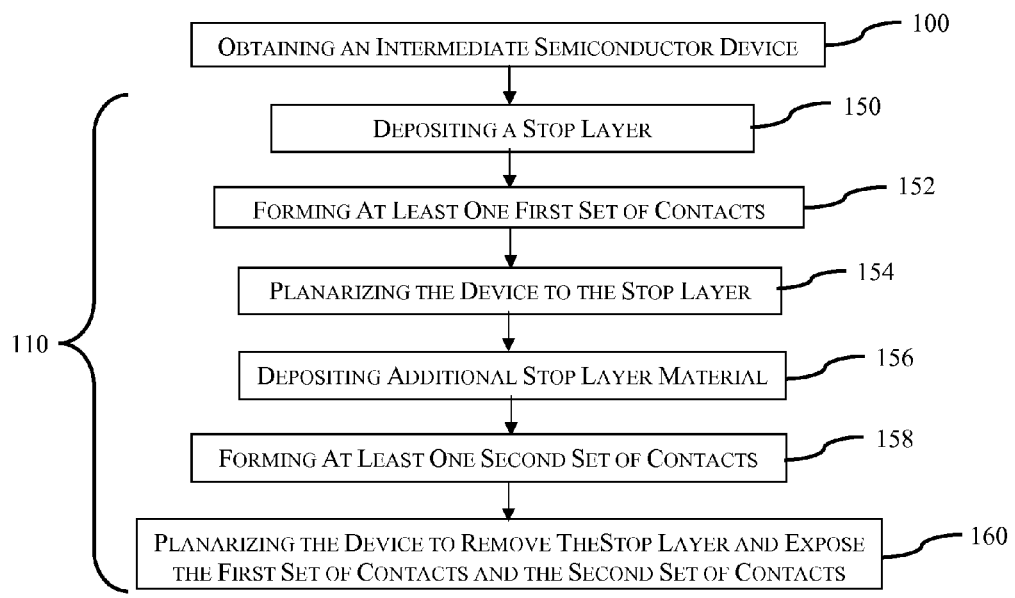
FIG. 1C depicts yet another embodiment of a method for forming semiconductor contacts, in accordance with one or more aspects of the present invention.

The process shown in FIG. 1A is inherent in the more detailed integrated circuit structure formation processes shown in FIGS. 1B and 1C. Specifically, the integrated circuit formation process of FIG. 1B is in accordance with one or more aspects of the present invention and may include, for instance: obtaining an intermediate semiconductor device 100 and forming at least one contact on the intermediate semiconductor device 110. The forming at least one contact on the intermediate semiconductor device 110 may include, for instance: forming at least one opening in the intermediate semiconductor device 112; applying a chemical oxide in the at least one opening 114; depositing a barrier layer 116; depositing at least one dielectric layer 118; annealing the intermediate semiconductor device 120; applying a photo resist layer 122; etching the dielectric layer(s) from at least one first set of openings 124; removing the photo resist layer 126; depositing a first metal layer 128; applying an organic planar layer over the device 130; etching the dielectric layer (s) from at least one second set of openings 132; removing the organic planar layer 134; depositing a second metal layer 136; depositing a third metal layer 138; and planarizing the device to form contacts 140.

Further, the integrated circuit formation process of FIG. 1C is in accordance with one or more aspects of the present invention and may include, for instance: obtaining an intermediate semiconductor device 100 and forming at least one contact on the intermediate semiconductor device 110. The forming at least one contact on the intermediate semiconductor device 110 may include, for instance: depositing a stop layer 150; forming at least one first set of contacts 152; planarizing the device to the stop layer 154; depositing additional stop layer material over the device 156; forming at least one second set of contacts 158; and planarizing the device to remove the stop layer and expose a first set of contacts and a second set of contacts 160.

FIGS. 2A-14 depict, by way of example only, one detailed embodiment of a portion of a FinFET device formation process and a portion of an intermediate FinFET structure, in accordance with one or more aspects of the present invention. Note again that these figures are not drawn to scale in order to facilitate understanding of the invention, and that the same reference numerals used throughout different figures designate the same or similar elements.

Figure 2A:
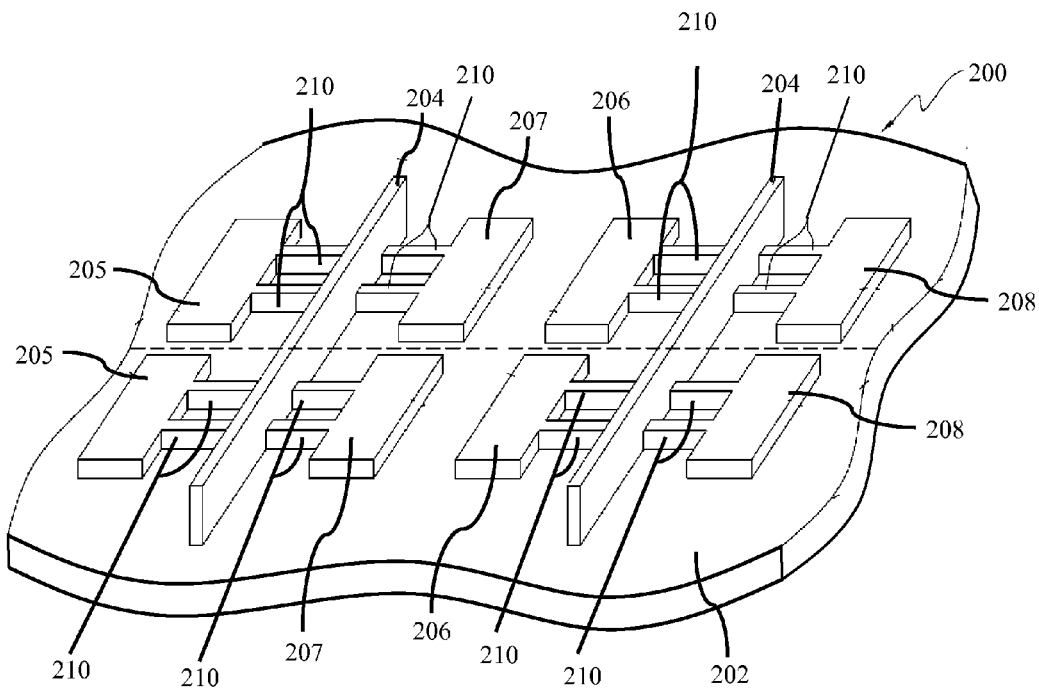
FIG. 2A depicts an isometric view of one embodiment of an integrated circuit with a varying gate structure disposed over a substrate structure, in accordance with one or more aspects of the present invention.
Figure 2B:
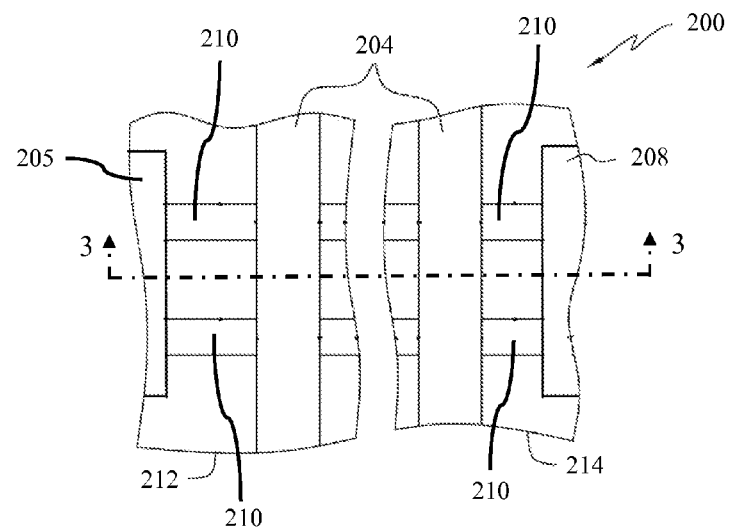
FIG. 2B depicts a plan view of one embodiment of an intermediate circuit structure of FIG. 2A obtained during circuit fabrication, in accordance with one or more aspects of the present invention.

FIG. 2A shows one embodiment of a portion of an integrated circuit 200 with varying gate structures 204 disposed over a substrate structure 202. The substrate 202 may be made of, for example, a semiconductor material, e.g., silicon (Si), germanium (Ge), a compound semiconductor material, and a layered semiconductor material. The integrated circuit 200 may also include at least one source region 205, 206 and at least one drain region 207, 208, which may be epitaxially grown in the substrate 202. The at least one source region 205 and at least one drain region 207 may be, for example, embedded silicon germanium (eSiGe) for pFETs. While the at least one source region 206 and at least one drain region 208 may be, for example, embedded silicon phosphorus (eSiP) for nFETs. The gate structures 204, at least one source 205, 206, and at least one drain 207, 208 may form at least one field-effect transistor. The integrated circuit 200 may also include at least one fin 210 with the at least one gate structure 204 positioned over the fins 210 and the fins 210 connecting the at least one source 205, 206 and at least one drain 207, 208. The integrated circuit device 200 may also include various isolation regions, doped regions, and/or other device features. A portion of the intermediate circuit structure 200 obtained during circuit fabrication is shown in FIG. 2B and includes a first portion 212 and a second portion 214.

Figure 3:
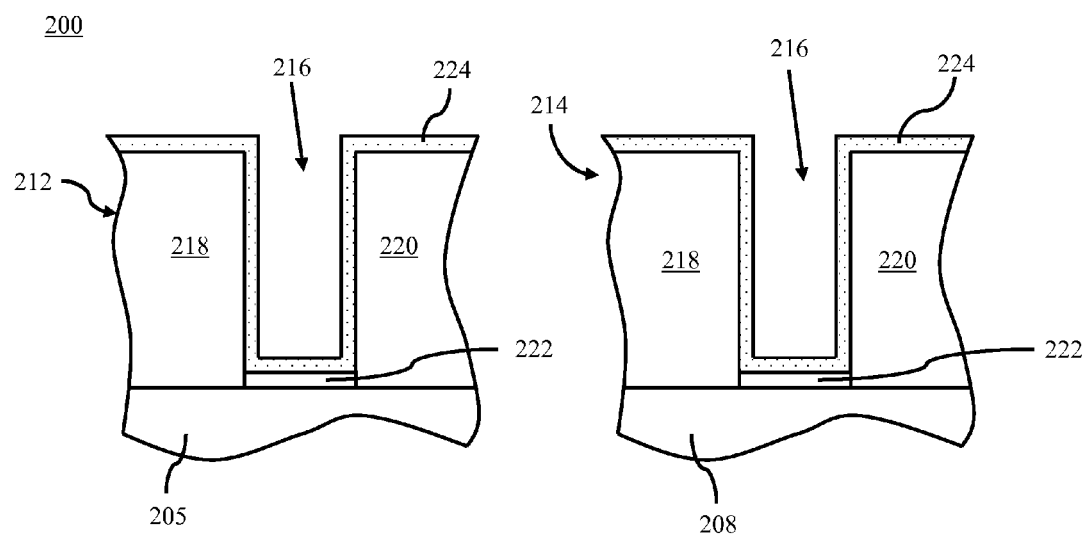
FIG. 3 depicts a cross-sectional elevation view of structures of FIG. 2B taken along line 3-3 during contact formation with a chemical oxide layer and barrier layer deposited, in accordance with one or more aspects of the present invention.

FIGS. 3-14 show two portions 212, 214 of the integrated circuit device 200 during the fabrication process. The device 200 may have been processed through initial device processing steps in accordance with the design of the device 200 being fabricated, for example, gate stack formation, such as, replacement gate. As shown in FIG. 3, the openings 216 are formed in at least a portion of the intermediate device 200, for example, between the spacers 218 and interlayer dielectric 220 of the intermediate device 200. A chemical oxide layer for first layer 222 may be formed in the openings 216, for example, in the bottom of the openings 216. Then a barrier layer 224 may be deposited over the entire integrated circuit device 200 and may cover the chemical oxide layer 222 and the sidewalls of the openings 216. The barrier layer 224 may be, for example, titanium nitride (TiN), tantalum nitride (TaN), or strontium titanium nitride (SrTiN), which may be deposited by, for example, atomic layer deposition (ALD). For a 7 nm to 10 nm device, the barrier layer 224 may range from, for example, approximately 0.5 nm to approximately 1.5 nm. The barrier layer 224 may assist in preventing bonds from forming between elements in the layers below the barrier layer 224 and the layers applied over the barrier layer 224. For example, the barrier layer 224 may assist in preventing titanium and silicon from bonding.

As depicted in FIG. 4A, a first dielectric layer 226 may be applied over the barrier layer 224 and a second dielectric layer 228 may be applied over the first dielectric layer 226. The first dielectric layer 226 may be, for example, a high K dielectric, such as, aluminum oxide ($Al_2O_3$), which may be applied by, for example, ALD. The first dielectric layer 226 may act as, for example, an etch stopper during contact formation. For a 7 nm to 10 nm device, the first dielectric layer 226 may range from, for example, approximately 1 nm to approximately 2 nm. The second dielectric layer 228 may be, for example, silicon dioxide ($SiO_2$), which may be applied by, for example, chemical vapor deposition (CVD). As shown in FIG. 4B, the bottom of the openings 216 may include a substrate portion 202, a chemical oxide layer 222, a barrier layer 224, a first dielectric layer 226, and a second dielectric layer 228.

Figure 5:
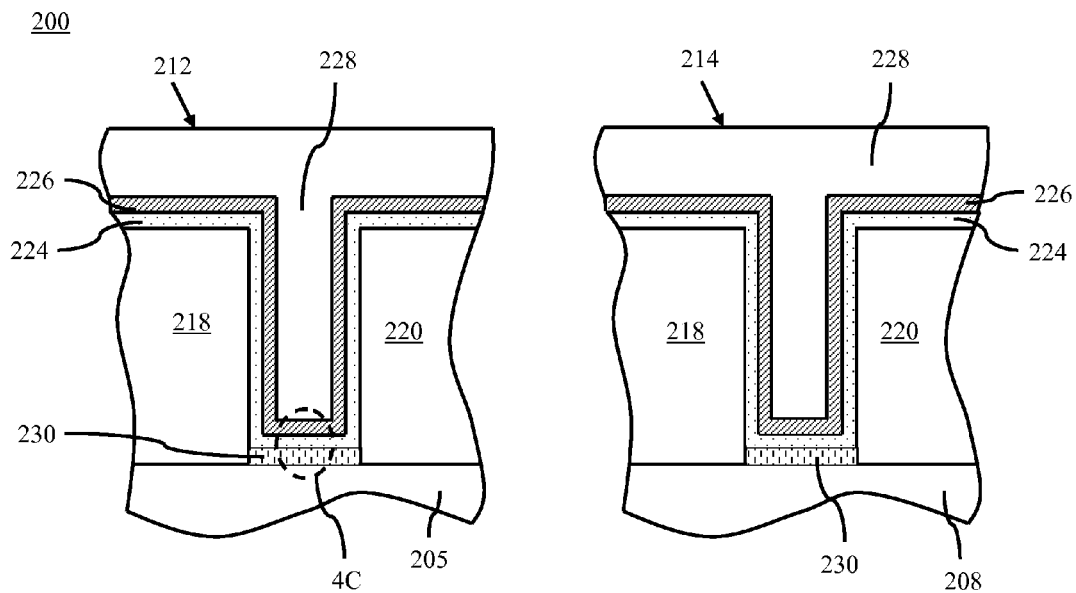
FIG. 5 depicts the structure of FIG. 4A after annealing the integrated circuit, in accordance with one or more aspects of the present invention.

After the dielectric layers 226, 228 are applied, the device 200 may be annealed to drive oxygen from the dielectric layer 228 through the dielectric layer 226 and the barrier layer 224 and into the chemical oxide layer 222 to form a metal layer 230, for example, titanium dioxide ($TiO_2$), as shown in FIG. 4C. The anneal may be, for example, a low temperature anneal with a temperature ranging from, for example, approximately 400° C. to approximately 600° C. and more preferably with a temperature of approximately 500° C. The oxygen atoms may be driven from, for example, a $SiO_2$ dielectric layer 228 into the chemical oxide layer 222 to form the TiO$_2$ metal layer 230. After the anneal the device 200, as shown in FIG. 5, may include a substrate 202, openings 216 positioned between spacers 218 and interlayer dielectric 220, and the openings 216 may include a metal layer 230, a barrier layer 224, a first dielectric layer 226, and a second dielectric layer 228.

Figure 6:
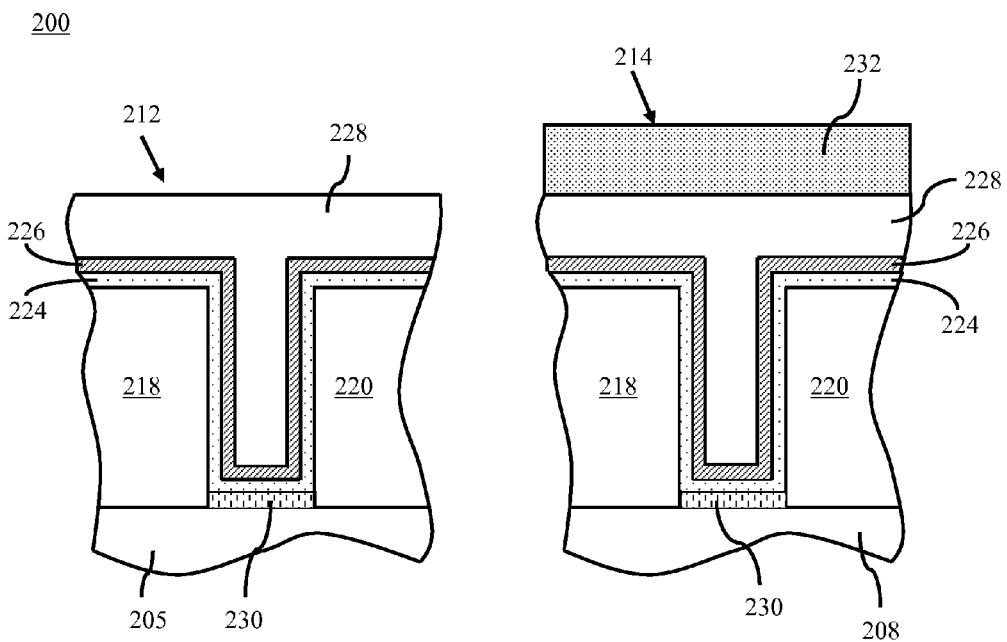
FIG. 6 depicts the structure of FIG. 5 after applying a photo resist layer over a portion of the integrated circuit, in accordance with one or more aspects of the present invention.
Figure 7:
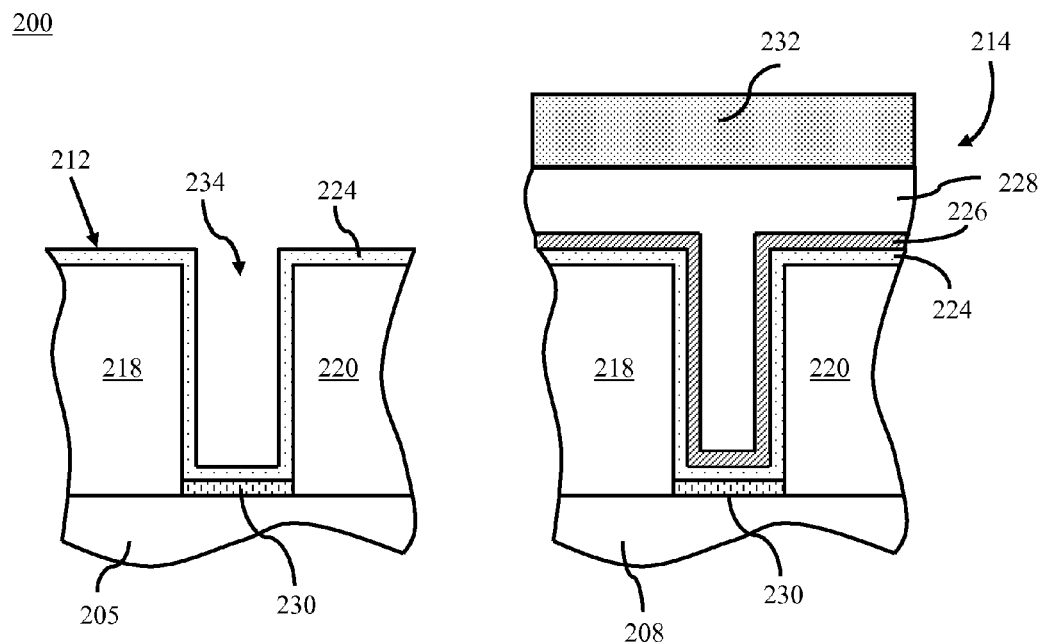
FIG. 7 depicts the structure of FIG. 6 after etching is performed, in accordance with one or more aspects of the present invention.

A photo resist layer 232 may then be applied over at least a portion of the device 200, as shown in FIG. 6. The photo resist layer 232 may be applied over, for example, the nFET trench contact regions of the device 200 design. Next, etching may be performed to remove the first and second dielectric layers 226, 228 from a first set of openings 234, leaving the barrier layer 224. The etching may be, for example, a diluted hafnium (Hf) etch to remove the second dielectric layer 228. To remove the first dielectric layer 226, the etching may be a selective etch, for example, ammonium hydroxide solution (NH$_4$OH:H$_2$O) or diluted tetra-methyl-ammonium hydroxide (TMAH or C$_4$H$_{13}$NO). The first set of openings 234 may be, for example, the pFET trench contact regions of the device 200, as shown in FIG. 7.

Figure 8:
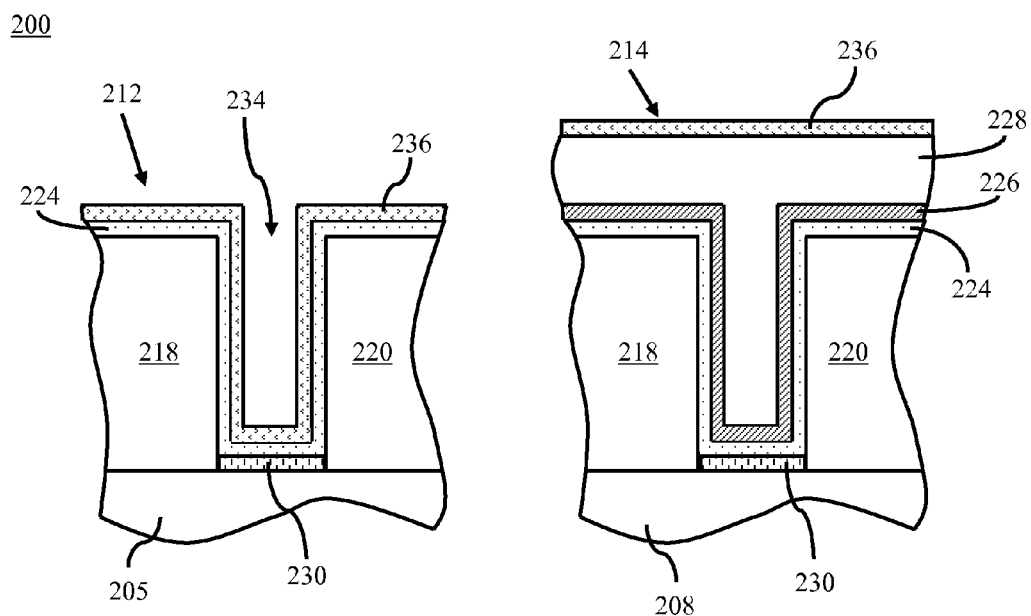
FIG. 8 depicts the structure of FIG. 7 after removing the photo resist layer and depositing a first metal layer, in accordance with one or more aspects of the present invention.

After the first set of openings 234 is formed, the photo resist layer 232 may be removed and a first metal layer 236 may be applied over the device 200, as shown in FIG. 8. The first metal layer 236 may be, for example, a p-metal, such as, molybdenum (Mo), ruthenium (Ru), cobalt (Co), nickel (Ni), and the like as known by one of ordinary skill in the art. The first metal 236 may be applied by, for example, physical layer deposition (PVD). For a 7 nm to 10 nm device, the first metal layer 236 may have a thickness ranging from, for example, approximately 5 nm to approximately 10 nm.

Figure 9:
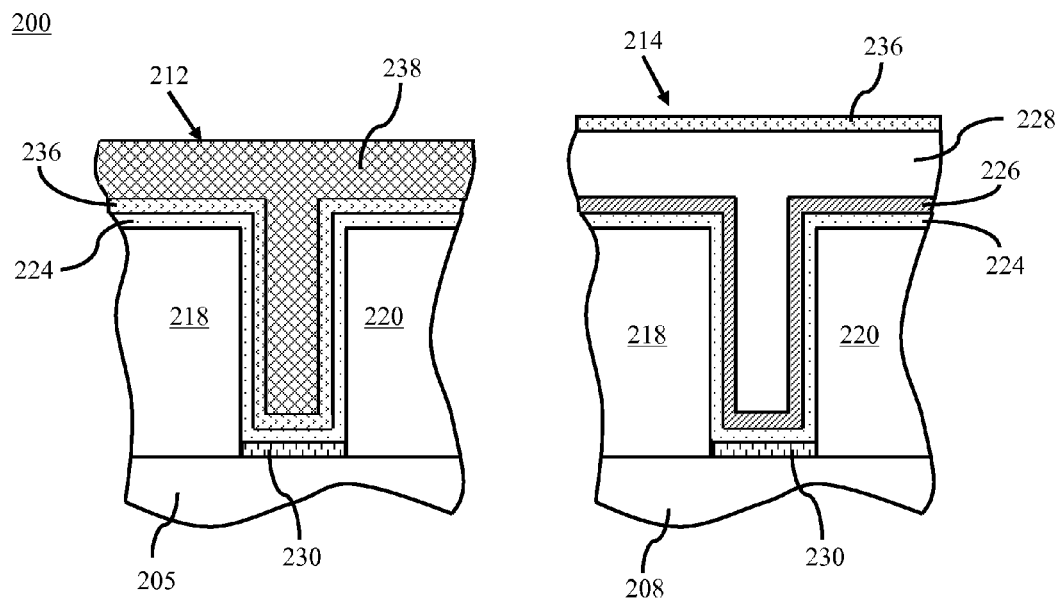
FIG. 9 depicts the structure of FIG. 8 after applying an organic planar layer, in accordance with one or more aspects of the present invention.
Figure 10:
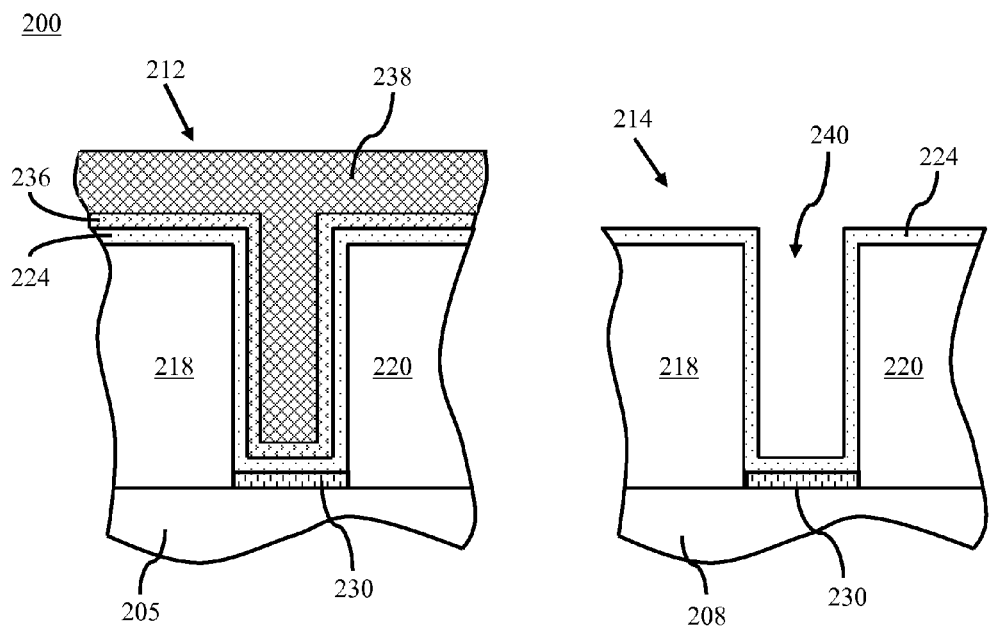
FIG. 10 depicts the structure of FIG. 9 after etching the intermediate structure, in accordance with one or more aspects of the present invention.

After applying the first metal layer 236, an organic planar layer 238 may be applied over the first set of openings 234, as shown in FIG. 9. The organic planar layer 238 may, for example, protect the first set of openings 234 during formation of a second set of openings 240, as shown in FIG. 10. The second set of openings 240 may be formed by etching the first metal layer 236 and the first and second dielectric layers 226, 228. The first metal layer 236 may be etched using, for example, a p-metal wet etch chemical, such as, HCl:H$_2$O$_2$ for Mo, HCl:NHO$_3$ for Ru, HCl:H$_2$O$_2$ for Co, HF:NHO$_3$ for Ni, and like solutions for other p-metals as known by one of ordinary skill in the art. The first and second dielectric layers 226, 228 may be etched as discussed above with reference to FIGS. 6 and 7 and which will not be discussed again here for brevity sake.

Figure 11:
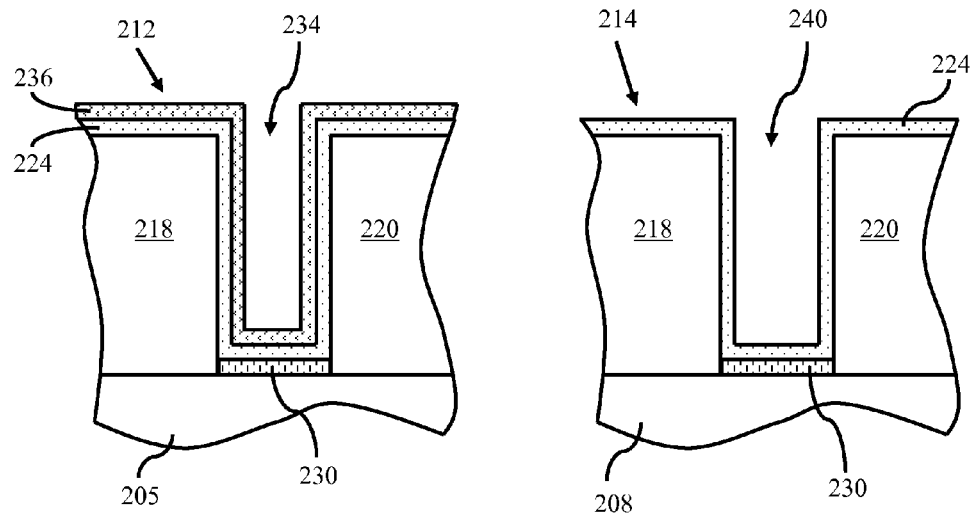
FIG. 11 depicts the structure of FIG. 10 after removing the organic planar layer, in accordance with one or more aspects of the present invention.
Figure 12:
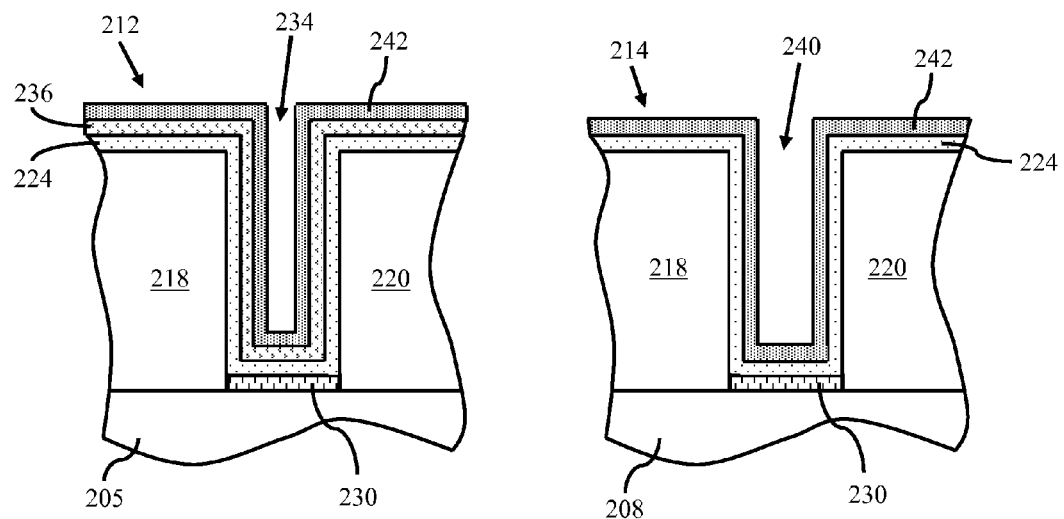
FIG. 12 depicts the structure of FIG. 11 after depositing a second metal layer, in accordance with one or more aspects of the present invention.

As shown in FIG. 11, after etching the first metal layer 236 and the first and second dielectric layers 226, 228, the organic planar layer 238 may be removed. Next, a second metal layer 242 may be deposited over the device 200, as shown in FIG. 12. The second metal layer 242 may be, for example, a n-metal, such as hafnium (Hf), titanium (Ti), zirconium (Zr), tantalum (Ta), aluminum (Al), niobium (Nb), and the like as known by one of ordinary skill in the art. The second metal layer 242 may be applied by, for example, PVD. For a 7 nm to 10 nm device, the second metal layer 242 may have a thickness ranging from, for example, approximately 5 nm to approximately 10 nm.

Figure 13:
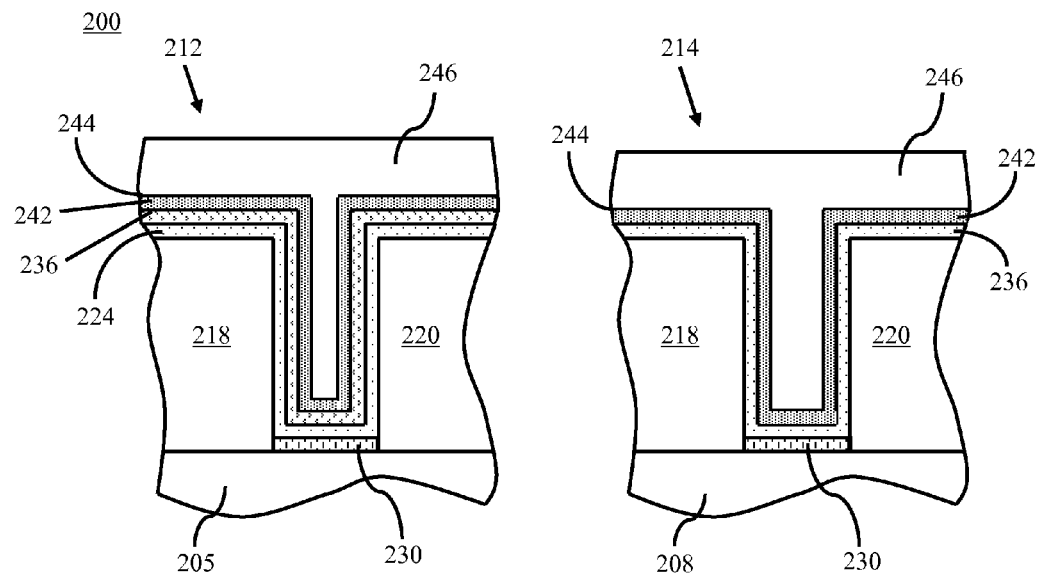
FIG. 13 depicts the structure of FIG. 12 after deposition of an adhesion layer and a third metal layer, in accordance with one or more aspects of the present invention.
Figure 14:
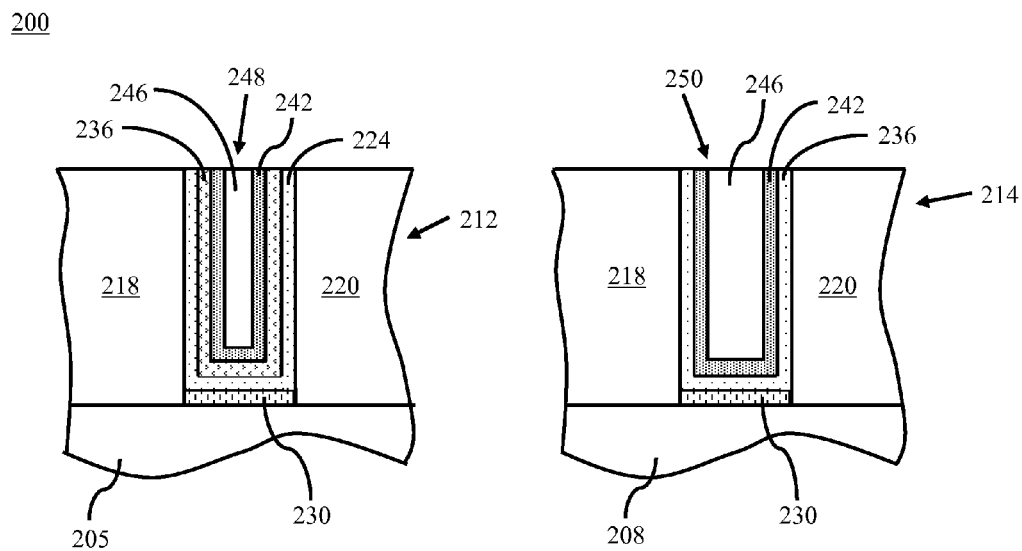
FIG. 14 depicts the structure of FIG. 13 after planarizing the device, in accordance with one or more aspects of the present invention.

As depicted in FIG. 13, in one embodiment, after a second metal layer 242 is deposited onto the device, an adhesion layer 244 may optionally be applied over the second metal layer 242. The adhesion layer 244 may be, for example, titanium nitride (TiN). Next, a third metal layer 246 may be deposited over the device 200. The third metal layer 246 may be, for example, a low resistivity metal, such as, tungsten (W), cobalt (Co), or another low resistivity metal known by one of ordinary skill in the art. The device 200 may then be planarized by, for example, chemical mechanical planarization (CMP). As shown in FIG. 14, the CMP may remove at least a portion of the third metal layer 246, the adhesion layer 244, the second metal layer 242, and the first metal layer 236 to form at least one first contact 248 and at least one second contact 250. The at least one first contact 248 may be, for example, a p-metal contact, and the at least one second contact 250 may be, for example, an n-metal contact. It is also contemplated that the n-metal contact may be formed first and then the p-metal contact could be formed, as described in greater detail above.

Figure 15:
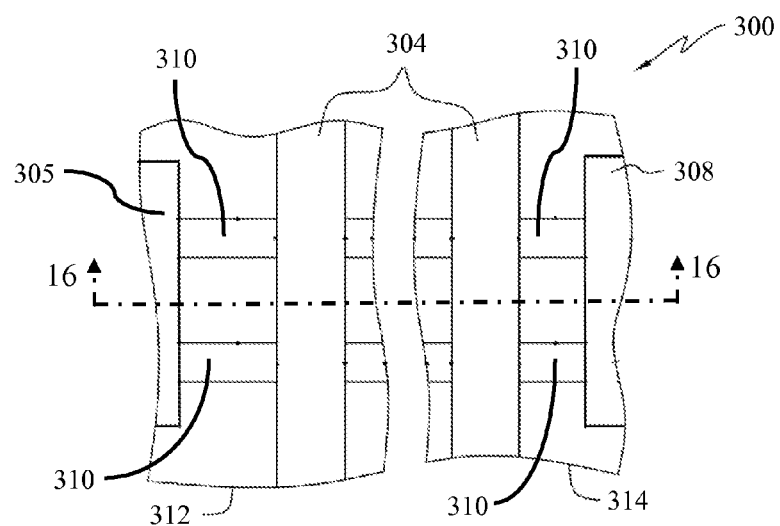
FIG. 15 depicts a plan view of another embodiment of an intermediate circuit structure of FIG. 2A obtained during circuit fabrication, in accordance with one or more aspects of the present invention.

A portion of the intermediate circuit structure 300 obtained during circuit fabrication is shown in FIG. 15 and may include a substrate structure 302, gate structures 304, at least one source region 305, 306, at least one drain region 307, 308, and at least one fin 310. As shown in FIG. 15 the substrate 302 may include a first portion 312 and a second portion 314. The substrate structure 302, gate structures 304, at least one source region 305, 306, at least one drain region 307, 308, at least one fin 310, first portion 312, and second portion 314 may be of the type described above with reference to the substrate structure 202, gate structures 204, at least one source region 205, 206, at least one drain region 207, 208, at least one fin 210, first portion 212, and second portion 214 as described above with reference to FIGS. 2A-2B, which will not be described again here for brevity sake.

Figure 16:
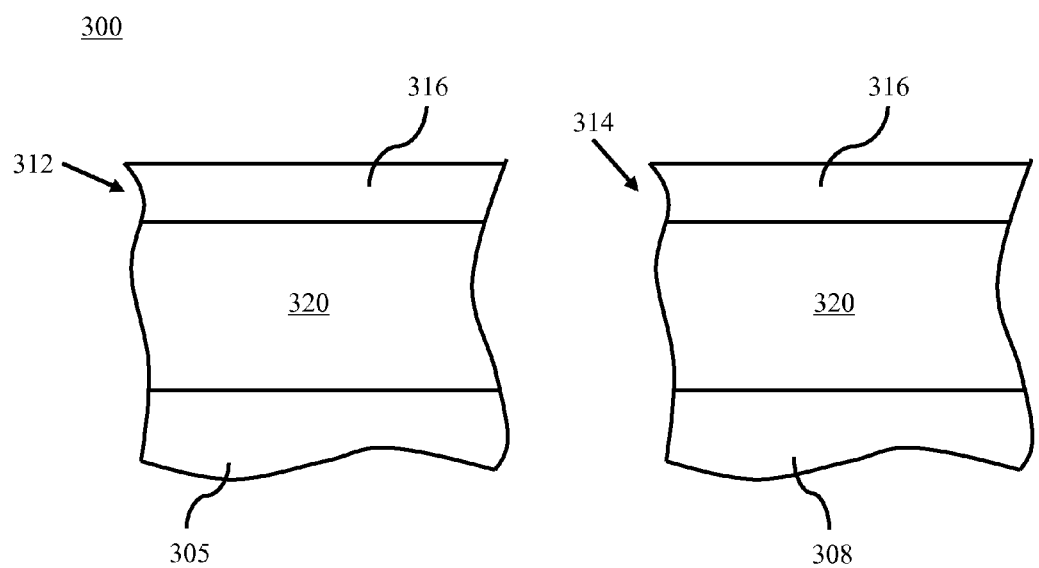
FIG. 16 depicts a cross-sectional elevation view of an intermediate structure of FIG. 15 taken along line 16-16 after depositing a stop layer over the integrated circuit device, in accordance with one or more aspects of the present invention.

FIGS. 16-33 show the two portions 312, 314 of the integrated circuit device 300 during the fabrication process. The device 300 may have been processed through initial device processing steps in accordance with the design of the device 300 being fabricated, for example, gate stack formation, such as, replacement gate. As shown in FIG. 16, an interlayer dielectric layer 320 may be deposited over the portions 312, 314 of the device 300. In addition, a stop layer 316 may be deposited over the interlayer dielectric layer 320. The stop layer 316 may be deposited by, for example, CMP. In addition, the stop layer 316 may be, for example, silicon nitride (SiN), silicon oxy-nitride (SiON), or another stop material as know by one of ordinary skill in the art.

Figures 17, 18:
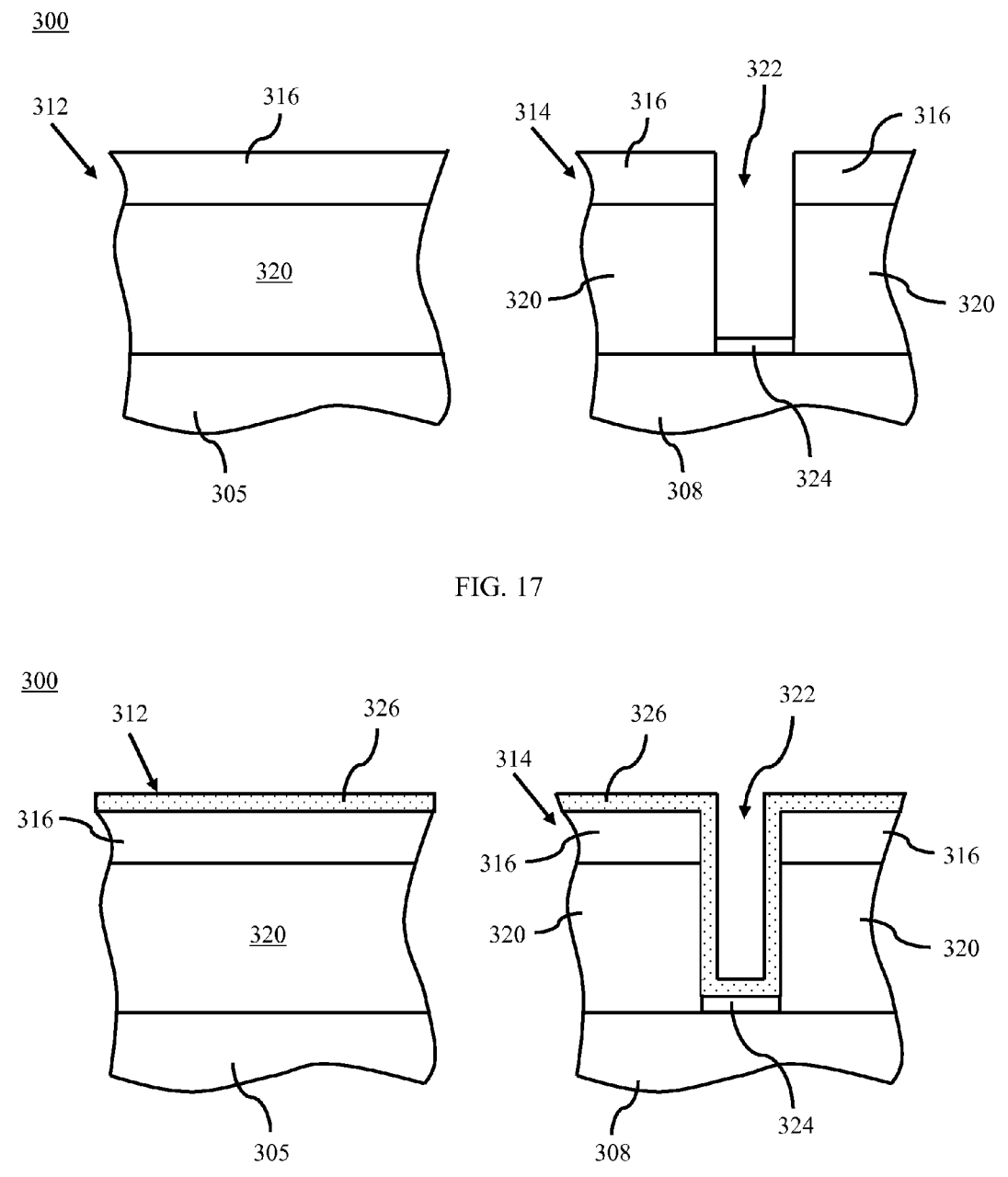

Next, at least one first opening 322 may be etched into the stop layer 316 and interlayer dielectric layer 320, as shown in FIG. 17. The at least one first opening 322 may be etched by, for example, reactive ion etching (RIE), and the at least one first opening 322 may be, for example, an nFET trench contact opening. A chemical oxide layer or first layer 324 may then be formed in the at least one first opening 322. The chemical oxide layer 324 may be formed by, for example, wet chemicals, and may be formed on the bottom of the openings 322. As shown in FIG. 18, a barrier layer 326 may then be applied over the entire device 300 including, for example, over the chemical oxide layer 324, the sidewalls of the openings 322, and the entire surface of the device 300. The barrier layer 326 may be, for example, ALD titanium nitride (TiN), which may have a thickness ranging from, for example, approximately 0.5 nm to approximately 1.5 nm for a 7 nm to 10 nm device.

Figure 19:
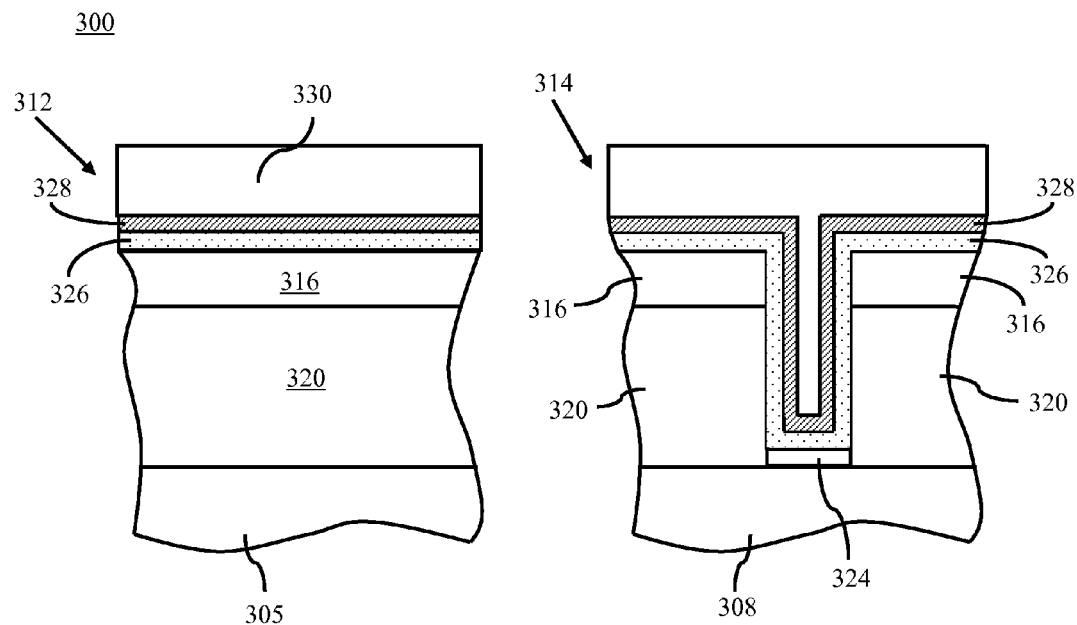
FIG. 19 depicts the structures of FIG. 18 after depositing at least one dielectric layer, in accordance with one or more aspects of the present invention.
Figure 20:
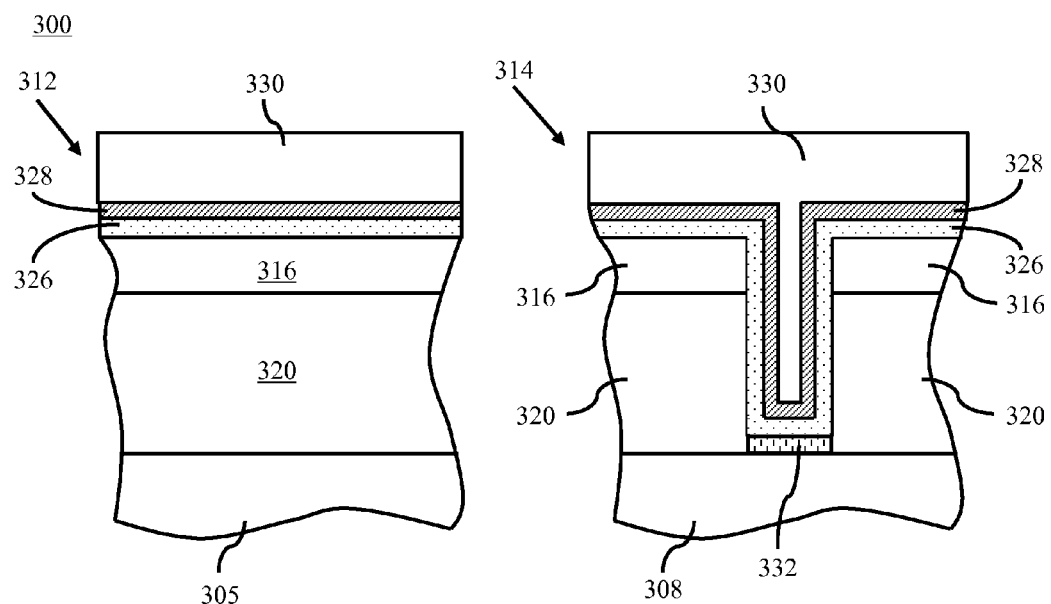
FIG. 20 depicts the structure of FIG. 19 after annealing the device, in accordance with one or more aspects of the present invention.

As depicted in FIG. 19, at least one dielectric layer, for example, a first dielectric layer 328 and a second dielectric layer 330, may be applied over the barrier layer 326. The first dielectric layer 328 may be, for example, ALD Al$_2$O$_3$, and the second dielectric layer 330 may be, for example, CVD SiO$_2$, as described in greater detail above with respect to first and second dielectric layers 226, 228 and which will not be described again here for brevity sake. After application of the first and second dielectric layers 328, 330, the device 300 may be annealed to drive oxygen from the second dielectric layer 330 through the first dielectric layer 328 and the barrier layer 326 and into the chemical oxide layer 324 to form a metal layer 332, for example, titanium dioxide ($TiO_2$), as shown in FIG. 20. The anneal may be, for example, a low temperature anneal with a temperature ranging from, for example, approximately 400° C. to approximately 600° C. and more preferably with a temperature of approximately 500° C. The oxygen atoms may be driven from, for example, a $SiO_2$ dielectric layer 330 into the chemical oxide layer 324 to form the $TiO_2$ metal layer 332. After annealing the device 300, as shown in FIG. 20, the at least one opening 322 of the device 300 may include a metal layer 332, a barrier layer 326, a first dielectric layer 328, and a second dielectric layer 330.

Figure 21:
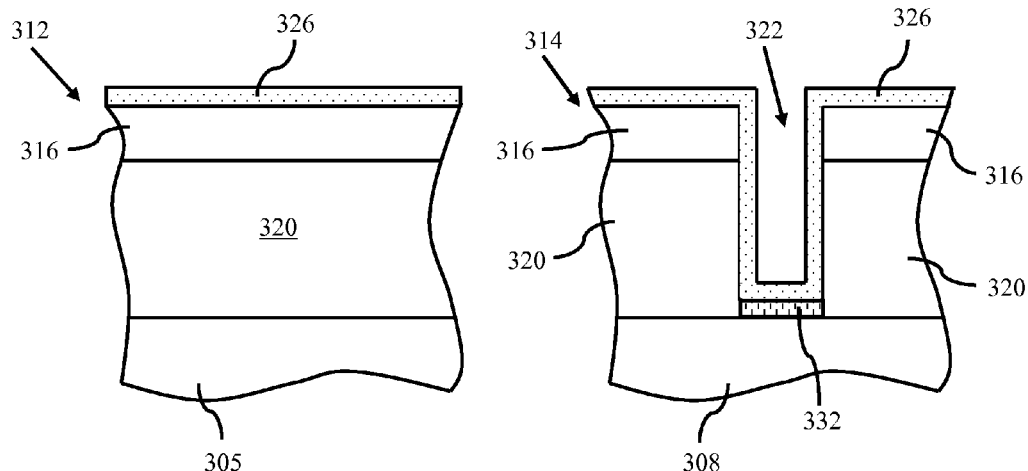
FIG. 21 depicts the structure of FIG. 20 after etching the dielectric layers, in accordance with one or more aspects of the present invention.
Figure 22:
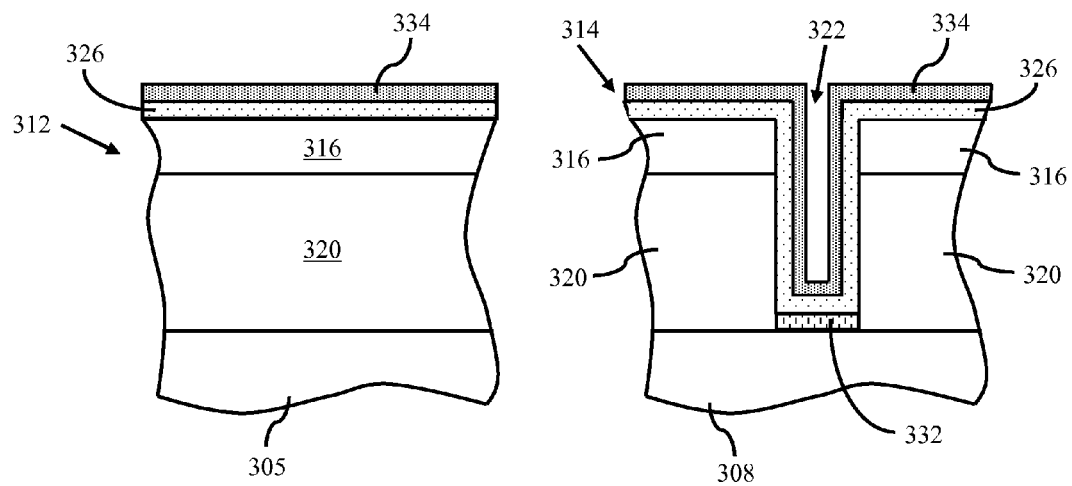
FIG. 22 depicts the structure of FIG. 21 after depositing a first metal layer, in accordance with one or more aspects of the present invention.

Next, etching may be performed to remove the first and second dielectric layers 328, 330 from the at least one first opening 322, leaving the barrier layer 326, as shown in FIG. 21. The etching may be, for example, a diluted hafnium (Hf) etch to remove the second dielectric layer 330. To remove the first dielectric layer 328, the etching may be a selective etch, for example, ammonium hydroxide solution ($NH_4OH:H_2O$) or diluted tetra-methyl-ammonium hydroxide (TMAH or $C_4H_{13}NO$). As shown in FIG. 22, a first metal layer 334 may be deposited onto the device 300 by, for example, PVD. The first metal layer 334 may be, for example, a n-metal, such as, magnesium (Mg), manganese (Mn), Hf, Ti, Zr, Ta, Al, Nb, and the like as known by one of ordinary skill in the art. The first metal layer 334 may have a thickness of, for example, approximately 5 nm to approximately 10 nm for a 7 nm to 10 nm device.

Figure 23:
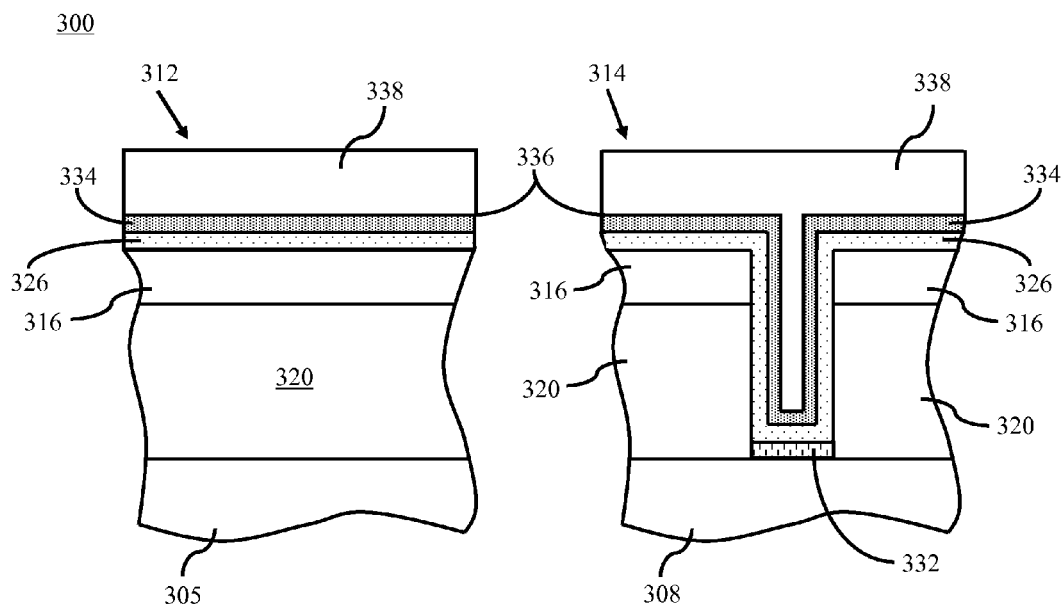
FIG. 23 depicts the structure of FIG. 22 after depositing an adhesion layer and a second metal layer, in accordance with one or more aspects of the present invention.
Figure 24:
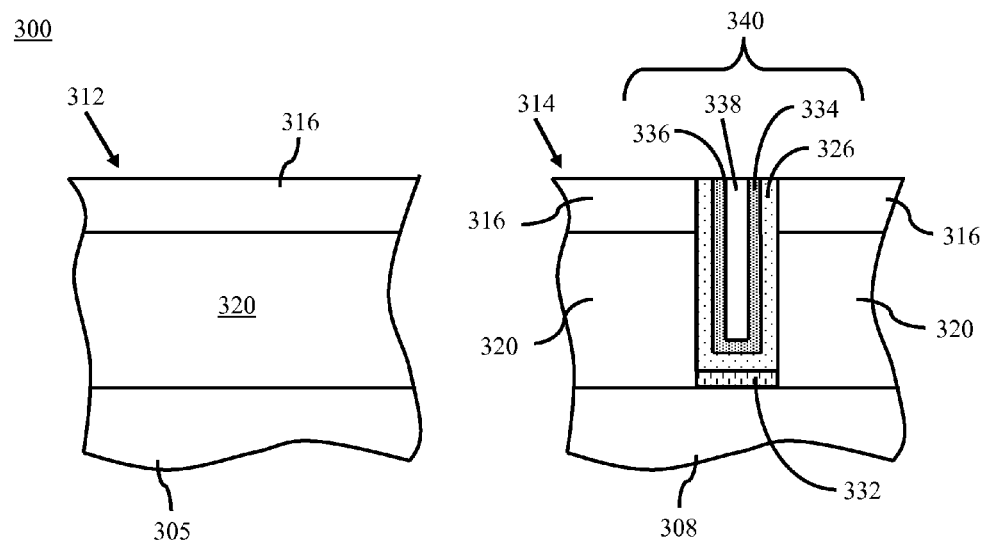
FIG. 24 depicts the structure of FIG. 23 after planarizing to the stop layer to form at least one nFET contact, in accordance with one or more aspects of the present invention.

As shown in FIG. 23, in one embodiment, an adhesion layer 336 may optionally be deposited over the first metal layer 334 and a second metal layer 338 may be deposited over the adhesion layer 336. The adhesion layer 336 may be, for example, TiN, and the second metal layer 338 may be, for example, a low resistivity metal, such as, W, Co, or another low resistivity metal known by one of ordinary skill in the art. Next, as shown in FIG. 24, a CMP may be performed to remove at least a portion of the second metal layer 338, a portion of the adhesion layer 336, a portion of the first metal layer 334, and a portion of the barrier layer 326 to form at least one first contact 340. The at least one first contact 340 may be, for example, at least one n-metal contact.

Figure 25:
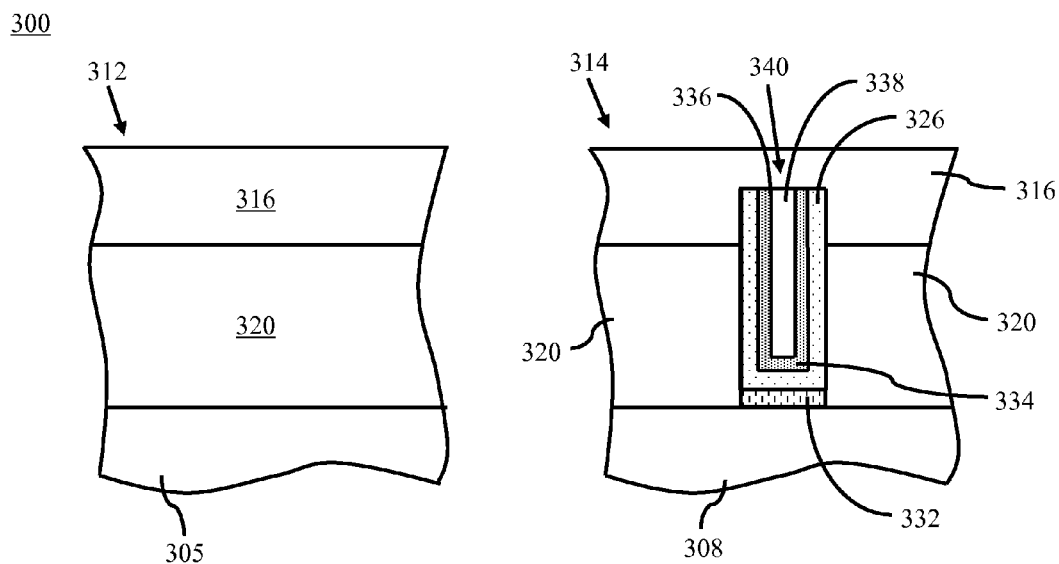
FIG. 25 depicts the structure of FIG. 24 after depositing additional stop layer material over the device, in accordance with one or more aspects of the present invention.
Figure 26:
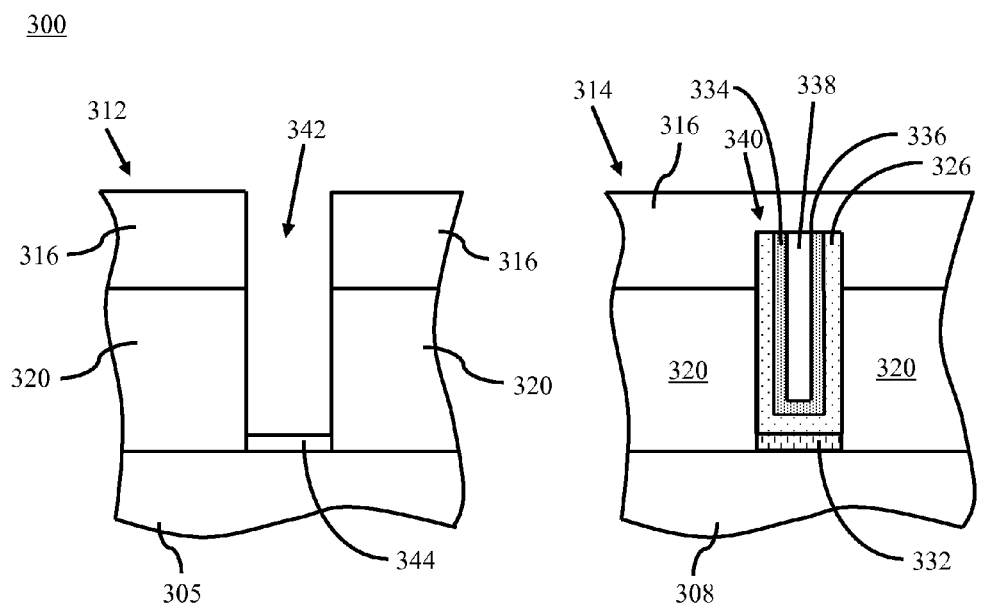
FIG. 26 depicts the structure of FIG. 25 after etching at least one pFET contact opening and forming a chemical oxide in the at least one pFET contact opening, in accordance with one or more aspects of the present invention.
Figure 27:
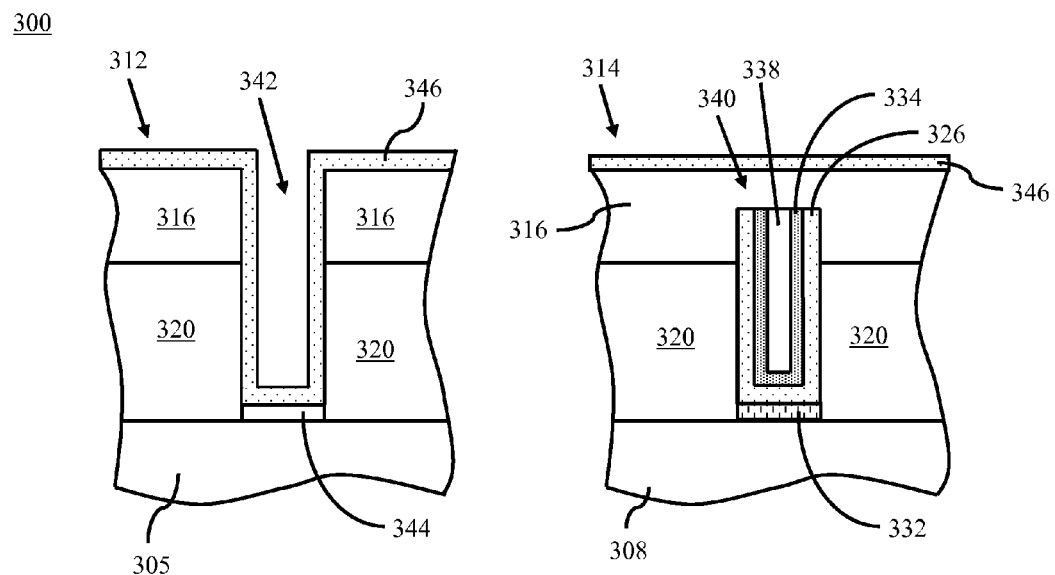
FIG. 27 depicts the structure of FIG. 26 after depositing a barrier layer over the device, in accordance with one or more aspects of the present invention.

After the at least one first contact 340 is formed, additional stop layer material may be applied to the stop layer 316 over the device 300 to cover the at least one first contact 340, as shown in FIG. 25. Then the device 300 may be etched to form at least one second opening 342 in the stop layer 316 and interlayer dielectric layer 320, as depicted in FIG. 26. The at least one second opening 342 may be etched by, for example, reactive ion etching (RIE) and the at least one second opening 342 may be, for example, a pFET trench contact opening. A chemical oxide layer or first layer 344 may then be formed in the at least one second opening 342, for example, on a bottom surface, as depicted in FIG. 26. The chemical oxide layer 344 may be formed by using, for example, wet chemicals. As shown in FIG. 27, a barrier layer 346 may then be applied over the device 300, as described in greater detail above with reference to FIG. 18, and which will not be described again here for brevity sake. The barrier layer 346 may be, for example, ALD TiN, which may have a thickness ranging from, for example, approximately 0.5 nm to approximately 1.5 nm for a 7 nm to 10 nm device.

Figure 28:
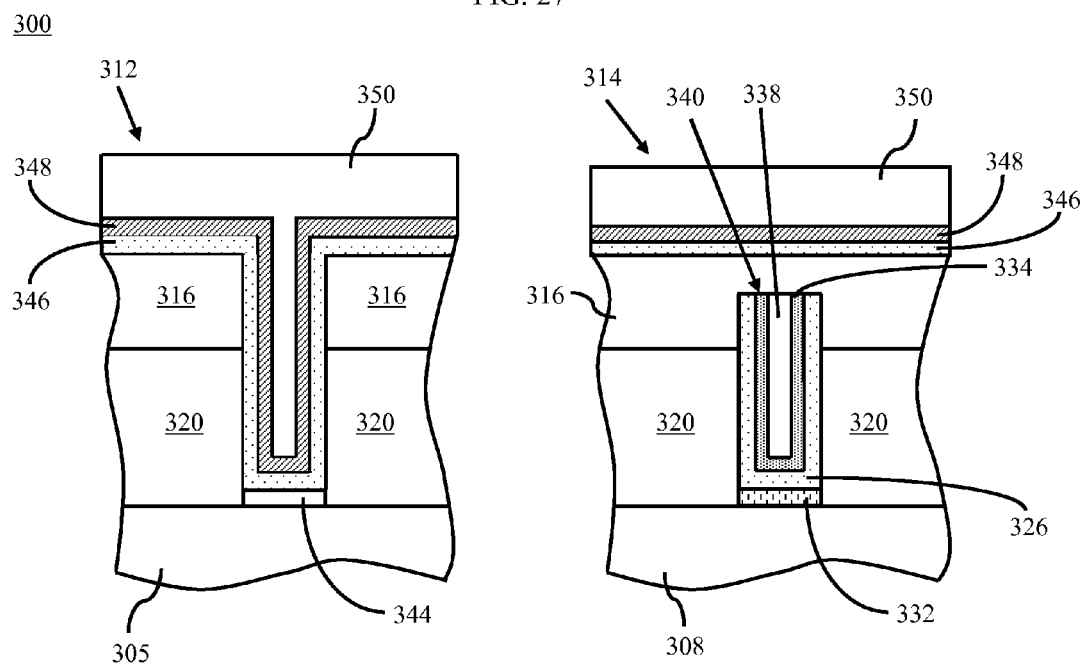
FIG. 28 depicts the structure of FIG. 27 after depositing at least one dielectric layer, in accordance with one or more aspects of the present invention.
Figure 29:
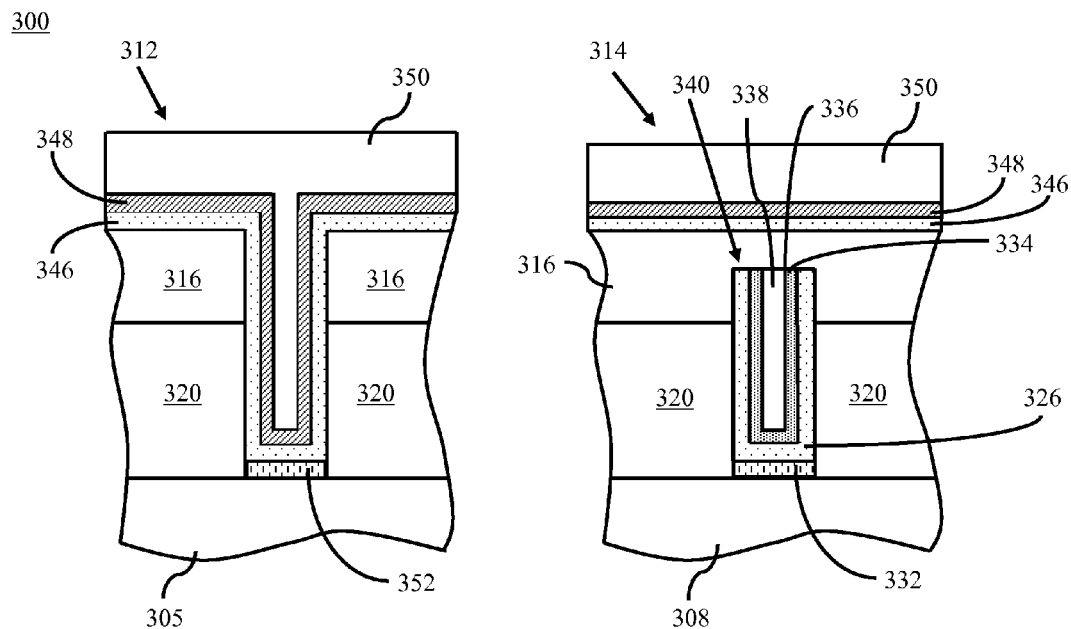
FIG. 29 depicts the structure of FIG. 28 after annealing the device, in accordance with one or more aspects of the present invention.

As depicted in FIG. 28, at least one dielectric layer, for example, a first dielectric layer 348 and a second dielectric layer 350, may be applied over the barrier layer 346. Although only two dielectric layers 348, 350 are shown in the depicted embodiments any number of dielectric layers is contemplated. The first dielectric layer 348 may be, for example, ALD $Al_2O_3$, and the second dielectric layer 350 may be, for example, CVD $SiO_2$, as described in greater detail above with respect to first and second dielectric layers 226, 228, 328, 330, and which will not be described again here for brevity sake. After the application of the first and second dielectric layers 348, 350, the device 300 may be annealed to drive oxygen from the second dielectric layer 350 through the first dielectric layer 348 and the barrier layer 346 and into the chemical oxide layer 344 to form a metal layer 352, for example, $TiO_2$, as shown in FIG. 29. The anneal may be, for example, a low temperature anneal as described above with reference to FIG. 20 and which will not be described again here for brevity sake. After annealing the device 300, as shown in FIG. 29, the at least one second opening 342 may include a metal layer 352, a barrier layer 346, a first dielectric layer 348, and a second dielectric layer 350.

Figure 30:
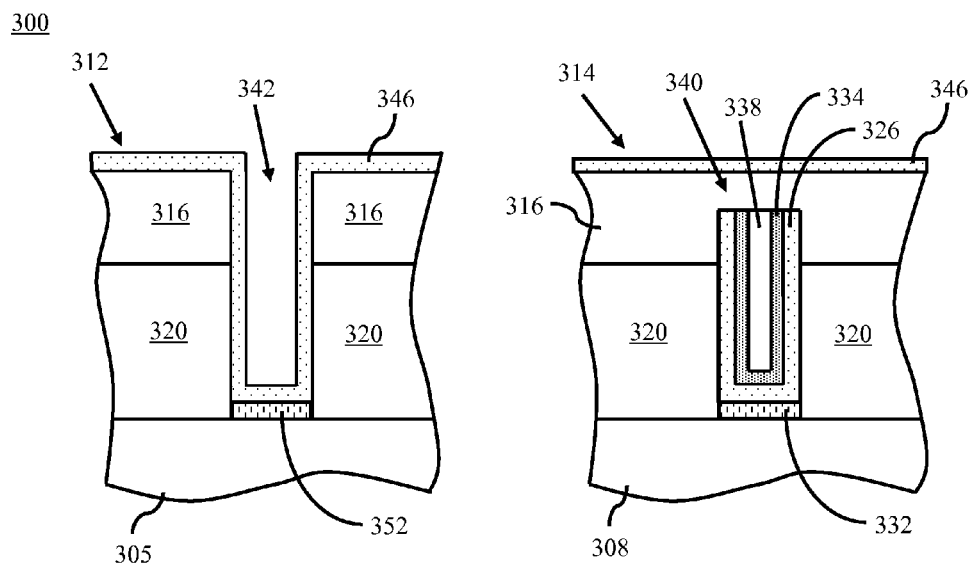
FIG. 30 depicts the structure of FIG. 29 after etching the dielectric layers, in accordance with one or more aspects of the present invention.
Figure 31:
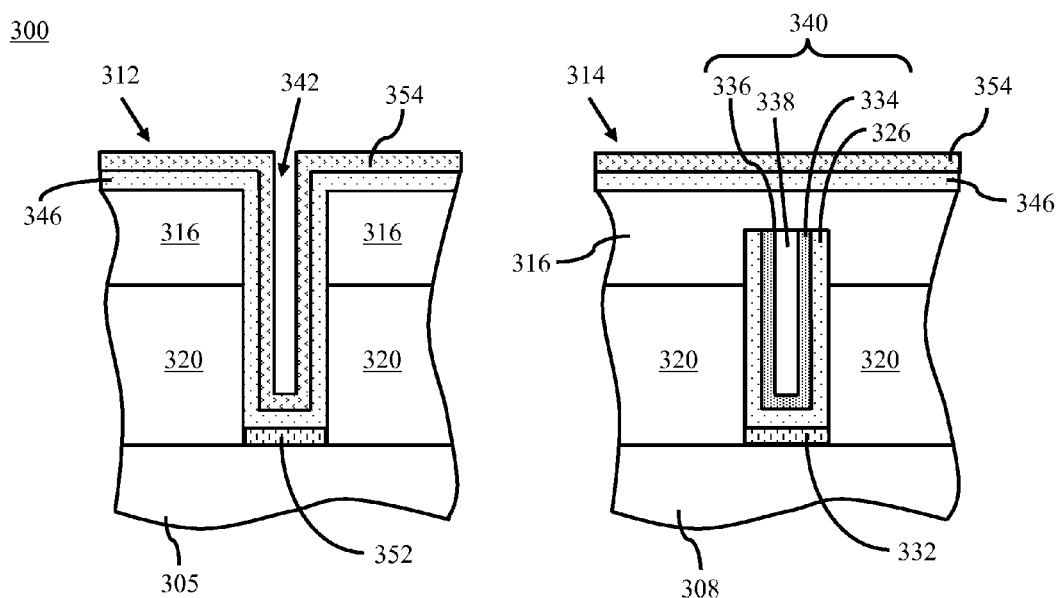
FIG. 31 depicts the structure of FIG. 30 after depositing a third metal layer, in accordance with one or more aspects of the present invention.

Next, etching may be performed to remove the first and second dielectric layers 348, 350 from the at least one second opening 342, down to the barrier layer 346, as shown in FIG. 30. The etching may be, for example, a diluted Hf etch to remove the second dielectric layer 350 and a selective etch, for example, $NH_4OH:H_2O$ or diluted TMAH or $C_4H_{13}NO$ to remove the first dielectric layer 348, as described in greater detail above and which will not be described again here for brevity sake. As shown in FIG. 31, a third metal layer 354 may be deposited onto the device 300 by, for example, PVD. The third metal layer 354 may, for example, line the at least one second opening 342 over the barrier layer 346. The third metal layer 354 may be, for example, a p-metal, such as, Mo, Ru, Co, Ni, and the like as known by one of ordinary skill in the art. The third metal layer 354 may have a thickness of, for example, approximately 5 nm to approximately 10 nm for a 7 nm to 10 nm device.

Figure 32:
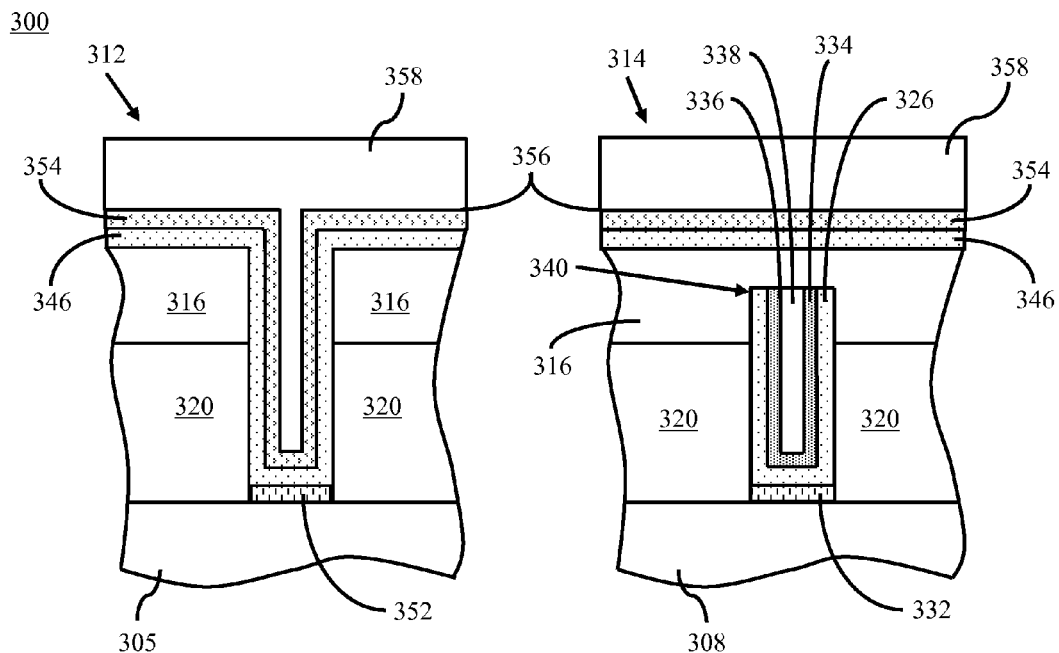
FIG. 32 depicts the structure of FIG. 31 after depositing an adhesion layer and a fourth metal layer, in accordance with one or more aspects of the present invention.
Figure 33:
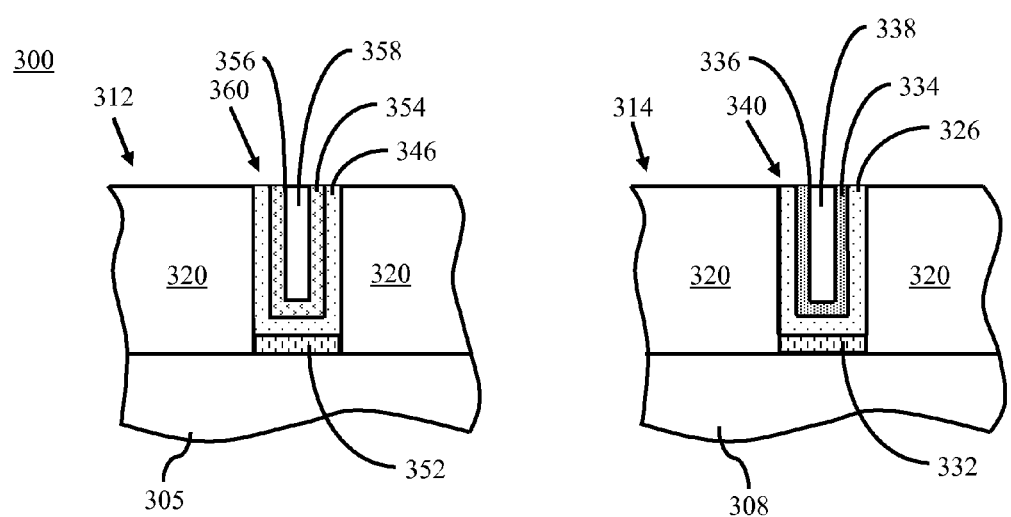
FIG. 33 depicts the structure of FIG. 32 after planarizing the device to remove the stop layer and expose at least one nFET contact and at least one pFET contact, in accordance with one or more aspects of the present invention.

As depicted in FIG. 32, in one embodiment, an adhesion layer 356 may optionally be deposited over the third metal layer 354 and a fourth metal layer 358 may be deposited over the adhesion layer 356. The adhesion layer 356 may be, for example, TiN, and the fourth metal layer 358 may be, for example, a low resistivity metal, such as, W, Co, or another low resistivity metal known by one of ordinary skill in the art. Next, as shown in FIG. 33, a CMP may be performed to remove at least a portion of the fourth metal layer 358, the adhesion layer 356, the third metal layer 354, and the barrier layer 346 to form at least one second contact 360. The at least one second contact 360 may be, for example, at least one p-metal contact. After the contact formation process is complete, the device 300 may include at least one first contact 340 and at least one second contact 360. As described in greater detail above, the at least one first contact 340 may be, for example, an n-metal contact, and the at least one second contact 360 may be, for example, a p-metal contact.

Figure 34:
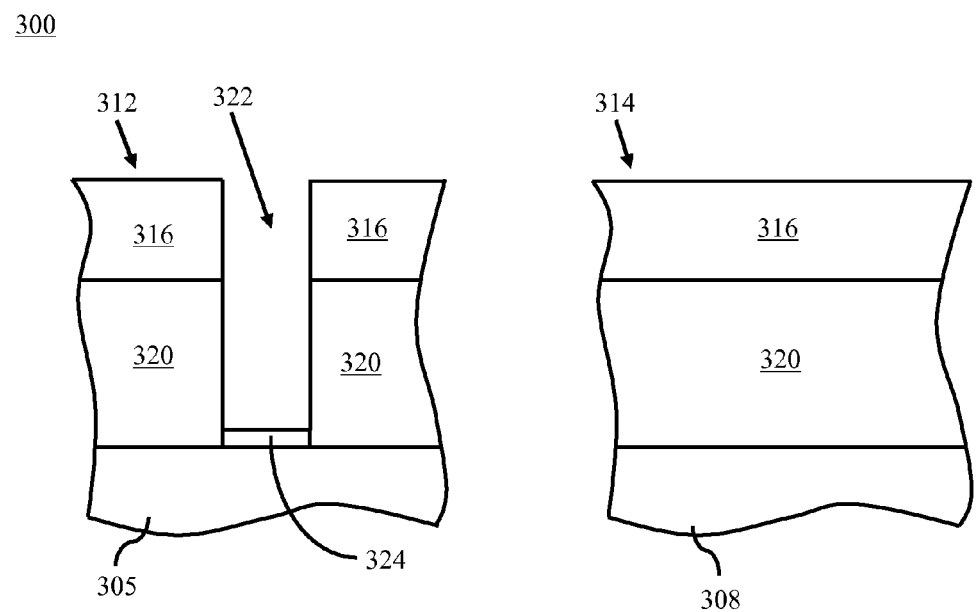
FIG. 34 depicts another embodiment of the structure of FIG. 16 after etching at least one pFET contact opening and forming an oxide layer in the at least one pFET contact opening, in accordance with one or more aspects of the present invention.

FIGS. 34-50 show an alternative fabrication process or method of the integrated circuit device 300 including two portions 312, 314. As described in greater detail above, the device 300 may have been processed through initial device processing steps in accordance with the design of the device 300 being fabricated, for example, gate stack formation, such as, replacement gate. The fabrication process shown in FIGS. 34-50 begins with the portions 312, 314 of FIG. 16, described in greater detail above and which will not be described again here for brevity sake. FIG. 34 shows at least one first opening 322 etched into the stop layer 316 and interlayer dielectric layer 320 of the first portion 312. The at least one first opening 322 may be etched by, for example, RIE, and the at least one first opening 322 may be, for example, a pFET trench contact opening. A chemical oxide layer 324 may then be formed in the at least one first opening 322, as described in greater detail above with reference to FIGS. 17 and 26, and which will not be described again here for brevity sake.

Figure 35:
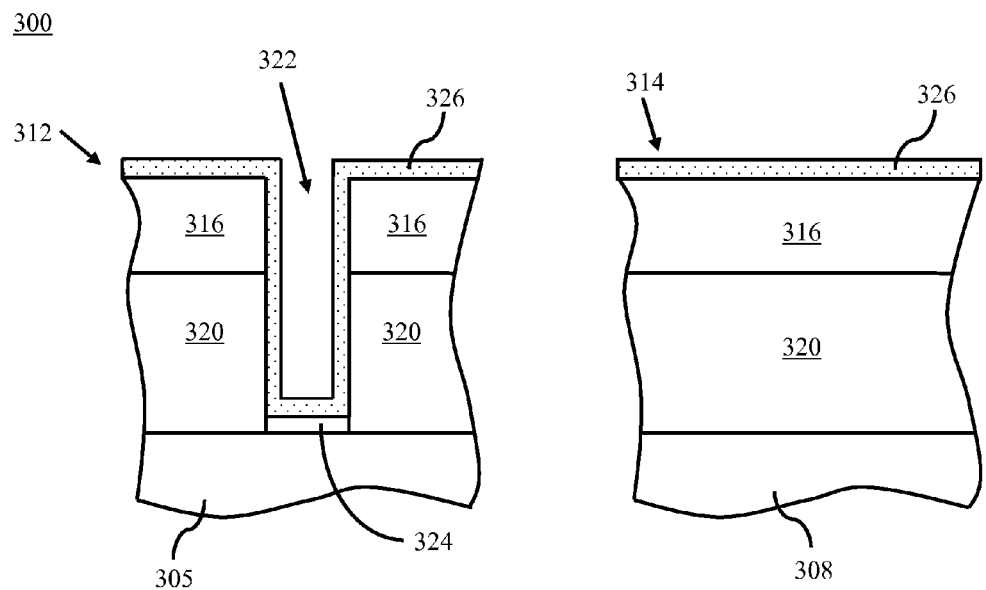
FIG. 35 depicts the structure of FIG. 34 after depositing a barrier layer over the integrated circuit, in accordance with one or more aspects of the present invention.
Figure 36:
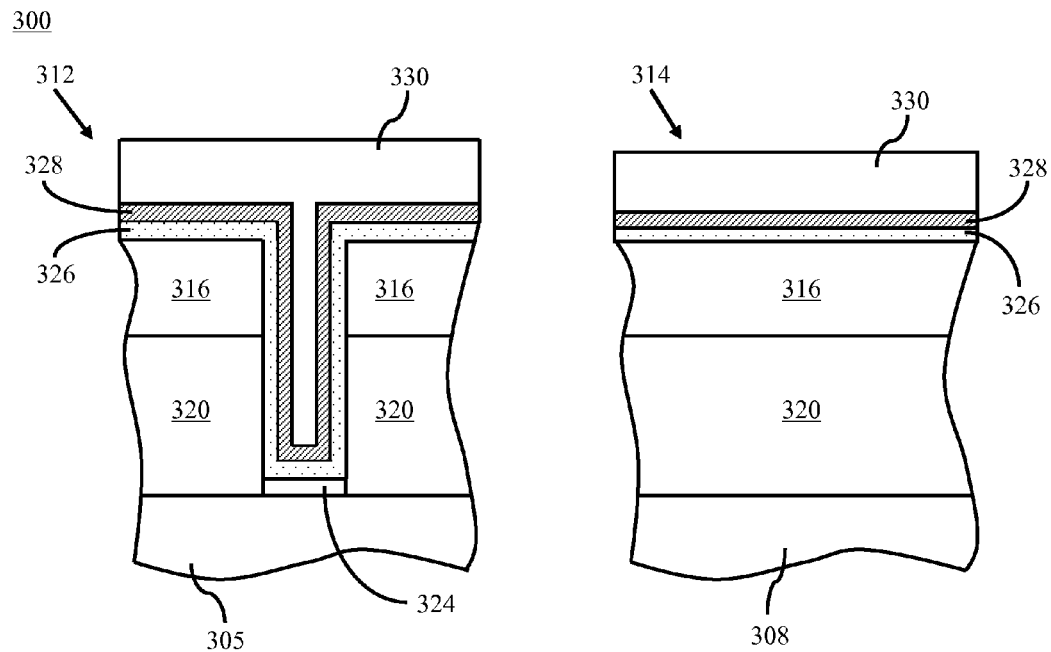
FIG. 36 depicts the structure of FIG. 35 after depositing at least one dielectric layer, in accordance with one or more aspects of the present invention.

As depicted in FIG. 35, a barrier layer 326 may then be applied over the device 300. The barrier layer 326 is as described above with reference to FIG. 18 and will not be described again here for brevity sake. FIG. 36 shows at least one dielectric layer, for example, a first dielectric layer 328 and a second dielectric layer 330, applied over the barrier layer 326. The first dielectric layer 328 may be, for example, ALD $Al_2O_3$, and the second dielectric layer 330 may be, for example, CVD $SiO_2$, as described in greater detail above with respect to FIGS. 19 and 28, and which will not be described again here for brevity sake.

Figure 37:
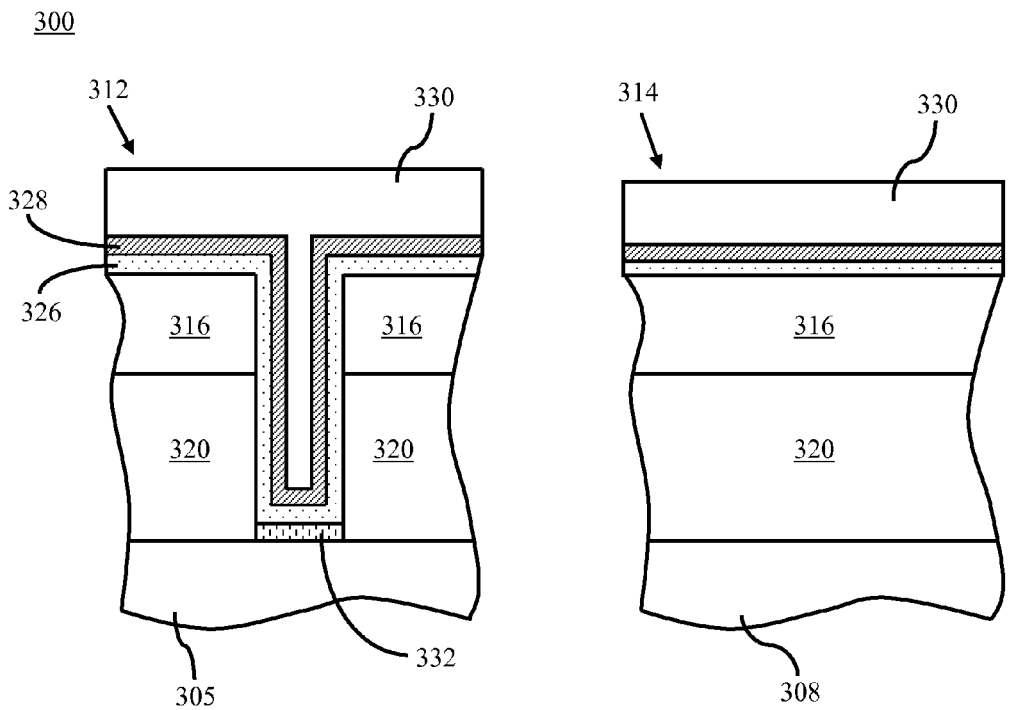
FIG. 37 depicts the structure of FIG. 36 after annealing the device, in accordance with one or more aspects of the present invention.

After application of the first and second dielectric layers 328, 330, the device 300 may be annealed to drive oxygen from the second dielectric layer 330 through the first dielectric layer 328 and the barrier layer 326 and into the chemical oxide layer 324 to form a metal layer 332, for example, $TiO_2$, as shown in FIG. 37. The anneal may be as described above with reference to FIGS. 20 and 29, and which will not be described again here for brevity sake. After annealing the device 300, the at least one opening 322 may include a metal layer 332, a barrier layer 326, a first dielectric layer 328, and a second dielectric layer 330.

Figure 38:
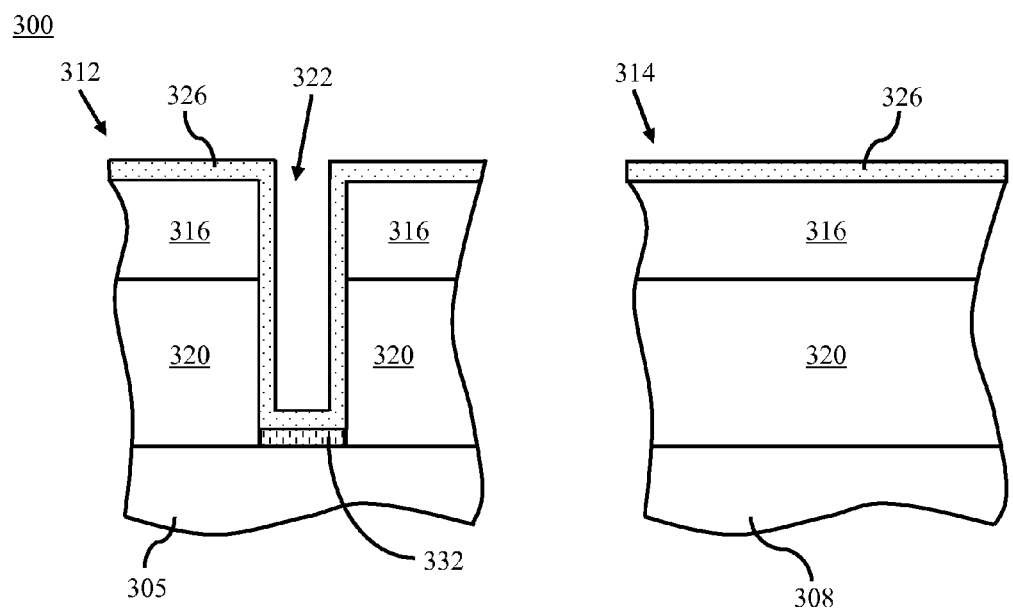
FIG. 38 depicts the structure of FIG. 37 after etching the dielectric layers, in accordance with one or more aspects of the present invention.
Figure 39:
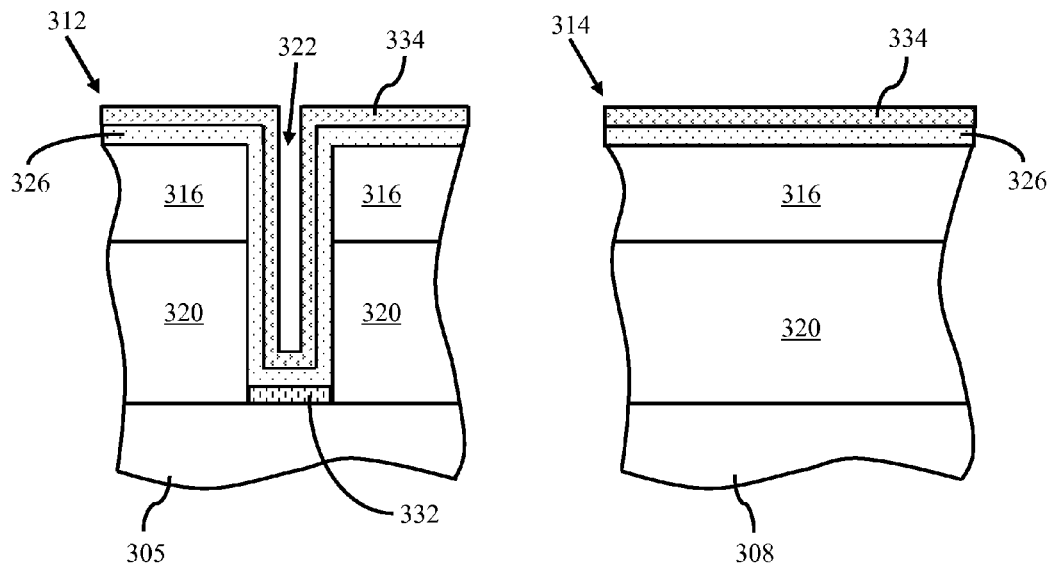
FIG. 39 depicts the structure of FIG. 38 after depositing a first metal layer, in accordance with one or more aspects of the present invention.

Next, etching may be performed to remove the first and second dielectric layers 328, 330 from the at least one first opening 322, leaving the barrier layer 326, as shown in FIG. 38. The etching may include, for example, diluted Hf etching to remove the second dielectric layer 330 and selective etching, such as, $NH_4OH:H_2O$ or diluted TMAH or $C_4H_{13}NO$ to remove the first dielectric layer 328, as described in greater detail above. As shown in FIG. 39, a first metal layer 334 may be deposited onto the device 300 by, for example, PVD. The first metal layer 334 may be, for example, a p-metal, such as, Mo, Ru, Co, Ni, and the like as known by one of ordinary skill in the art. The first metal layer 334 may have a thickness of, for example, approximately 5 nm to approximately 10 nm for a 7 nm to 10 nm device.

Figure 40:
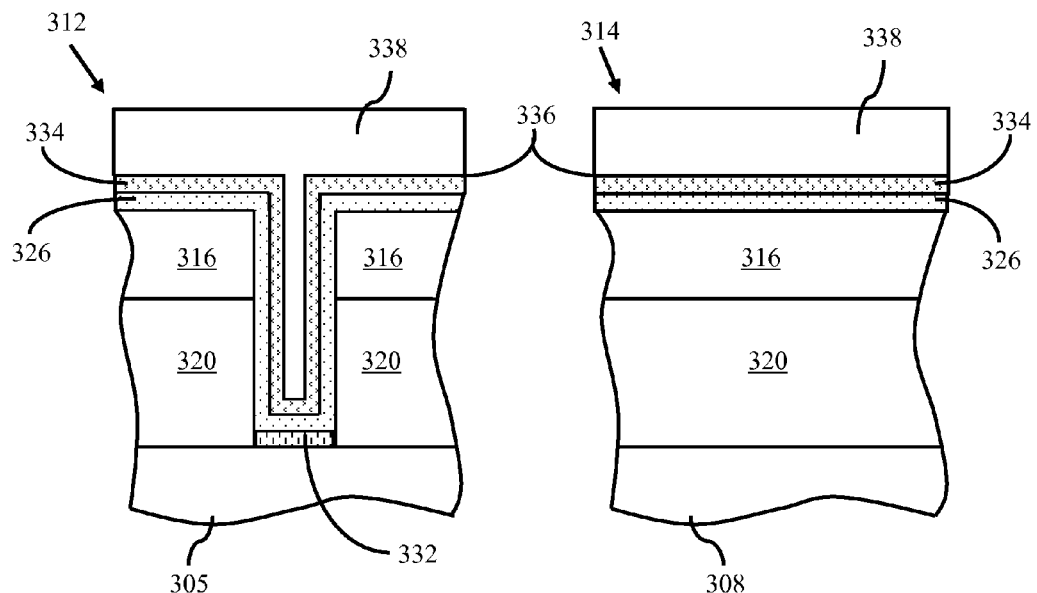
FIG. 40 depicts the structure of FIG. 39 after depositing an adhesion layer and a second metal layer, in accordance with one or more aspects of the present invention.
Figure 41:
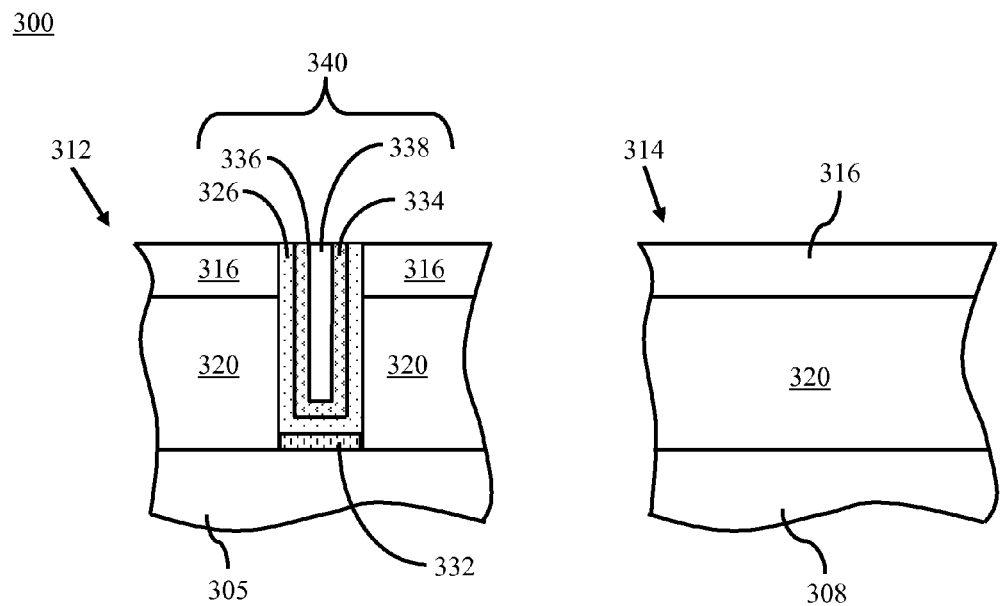
FIG. 41 depicts the structure of FIG. 40 after planarizing to the stop layer to form at least one pFET contact, in accordance with one or more aspects of the present invention.

As shown in FIG. 40, in one embodiment, an adhesion layer 336 may optionally be deposited over the first metal layer 334 and a second metal layer 338 may be deposited over the adhesion layer 336. The adhesion layer 336 and the second metal layer 338 may be of the type described above with reference to FIGS. 23 and 32. Next, as shown in FIG. 41, a CMP may be performed to remove at least a portion of the second metal layer 338, a portion of the adhesion layer 336, a portion of the first metal layer 334, and a portion of the barrier layer 326 to form at least one first contact 340. The at least one first contact 340 may be, for example, at least one p-metal contact.

Figure 42:
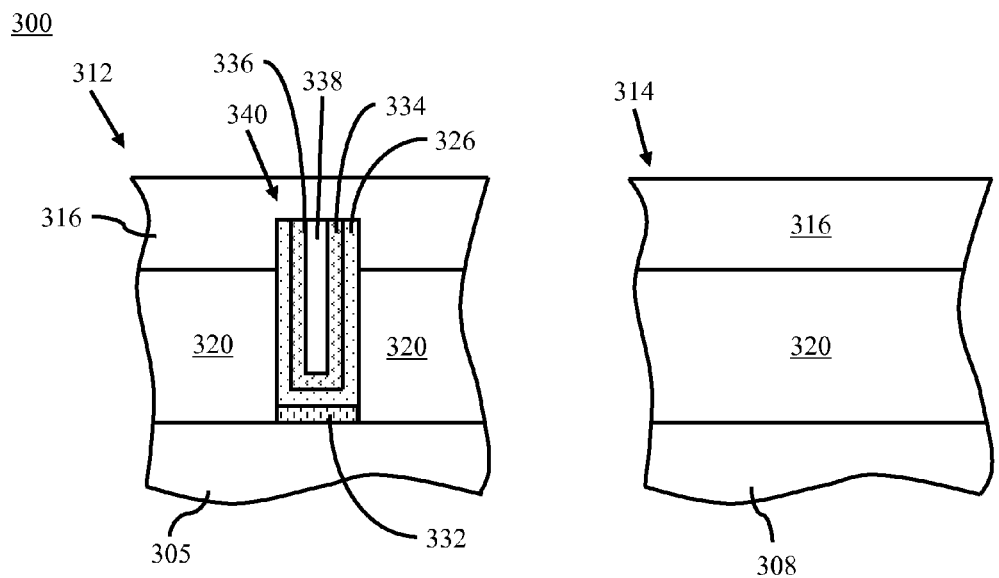
FIG. 42 depicts the structure of FIG. 41 after depositing additional stop layer material over the device, in accordance with one or more aspects of the present invention.
Figure 43:
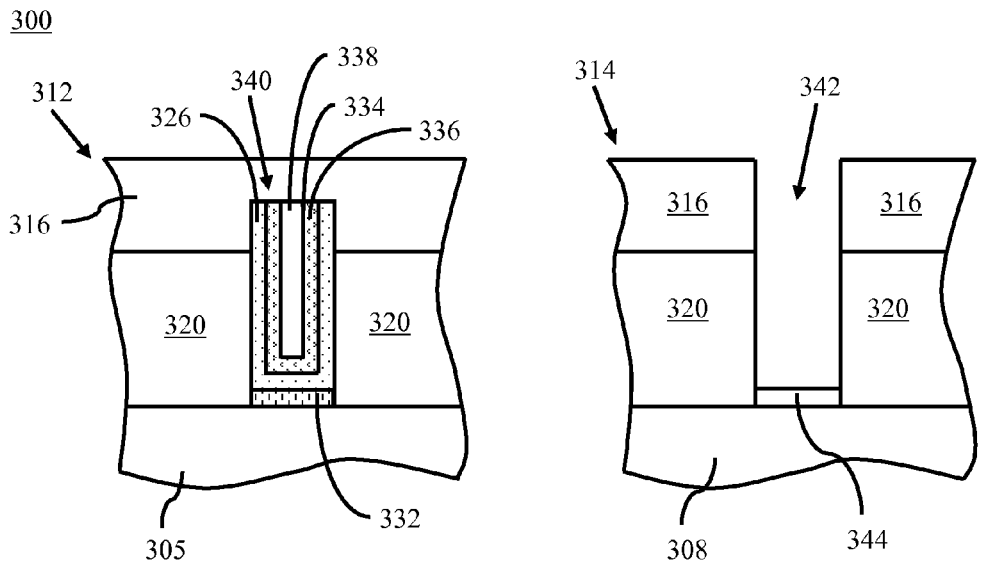
FIG. 43 depicts the structure of FIG. 42 after etching at least one nFET contact opening and forming a chemical oxide in the at least one nFET contact opening, in accordance with one or more aspects of the present invention.
Figure 44:
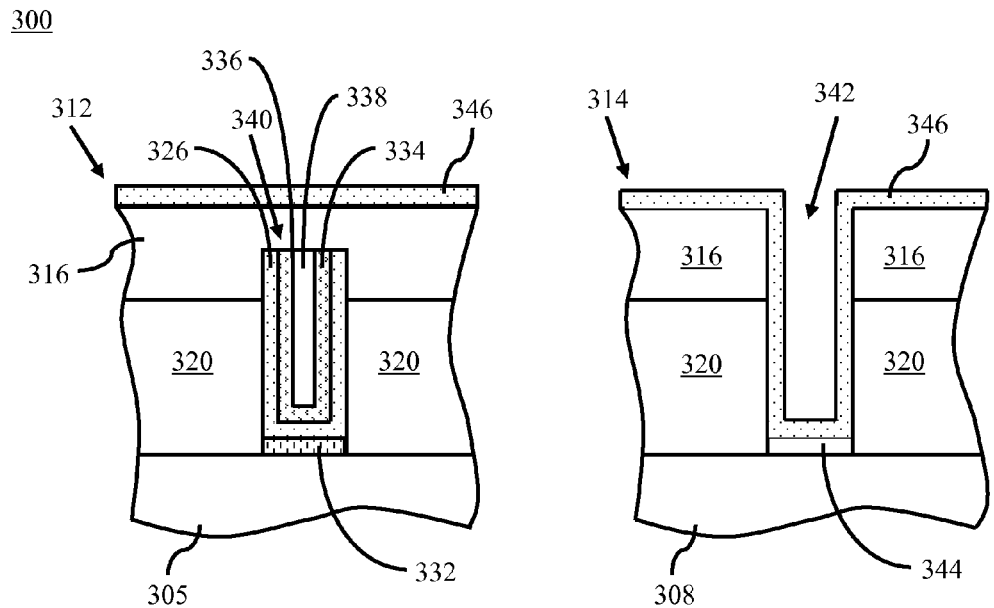
FIG. 44 depicts the structure of FIG. 43 after depositing a barrier layer over the device, in accordance with one or more aspects of the present invention.

After the at least one first contact 340 is formed, additional stop layer material may be applied to the stop layer 316 over the device 300 to cover the at least one first contact 340, as shown in FIG. 42. Then the device 300 may be etched to form at least one second opening 342 in the stop layer 316 and interlayer dielectric layer 320 of the second portion 314, as depicted in FIG. 43. The at least one second opening 342 may be etched by, for example, RIE and the at least one second opening 342 may be, for example, an nFET trench contact opening. A chemical oxide layer 344 may then be formed in the at least one second opening 342, for example, on a bottom surface of the openings 342, as depicted in FIG. 43. The chemical oxide layer 344 may be formed by using, for example, wet chemicals, as described in greater detail above with reference to FIGS. 17 and 26. As shown in FIG. 44, a barrier layer 346 may then be applied over the device 300, as described above with reference to FIG. 18 and which will not be described again here for brevity sake. The barrier layer 346 may be, for example, ALD TiN, which may have a thickness ranging from, for example, approximately 0.5 nm to approximately 1.5 nm for a 7 nm to 10 nm device.

Figure 45:
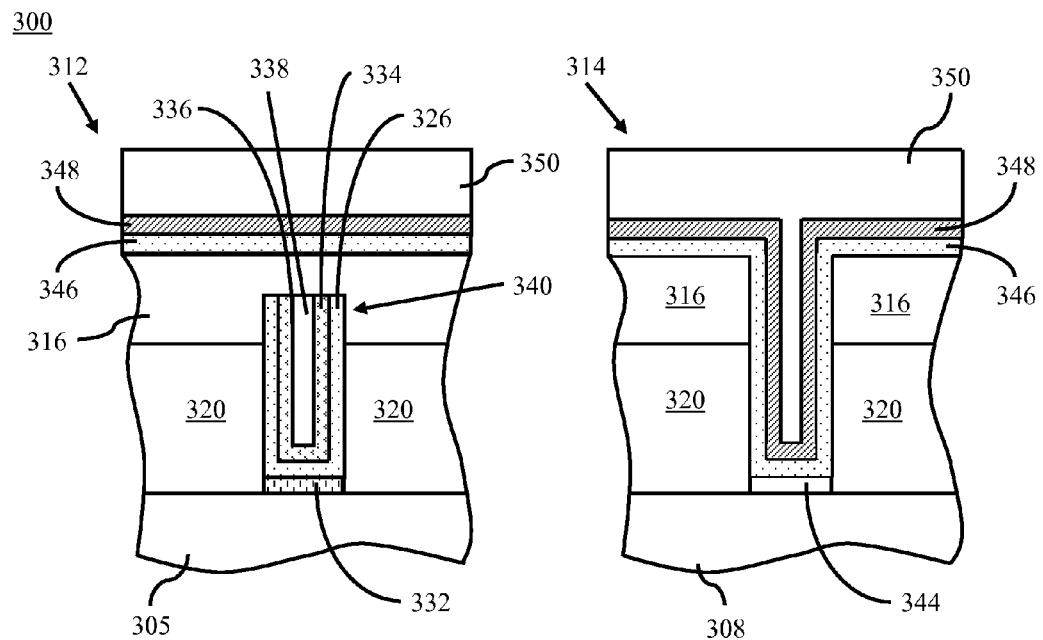
FIG. 45 depicts the structure of FIG. 44 after depositing at least one dielectric layer, in accordance with one or more aspects of the present invention.
Figure 46:
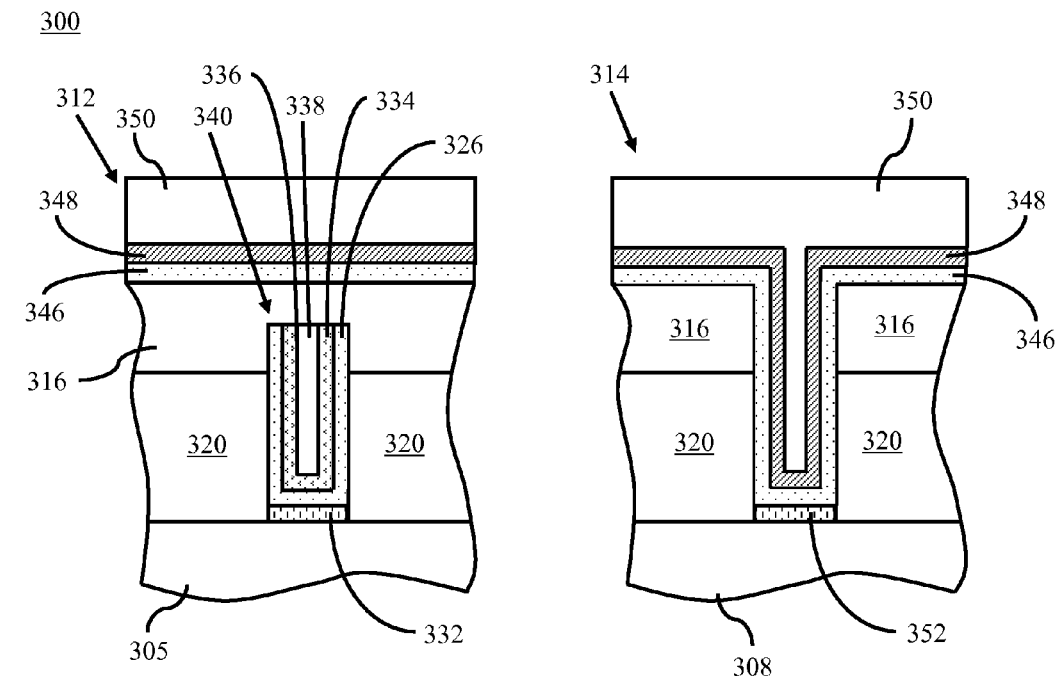
FIG. 46 depicts the structure of FIG. 45 after annealing the device, in accordance with one or more aspects of the present invention.

As depicted in FIG. 45, at least one dielectric layer, for example, a first dielectric layer 348 and a second dielectric layer 350, may be applied over the barrier layer 346. Although only two dielectric layers 348, 350 are shown in the depicted embodiments any number of dielectric layers are contemplated. The first dielectric layer 348 may be, for example, ALD $Al_2O_3$, and the second dielectric layer 350 may be, for example, CVD $SiO_2$, as described in greater detail above with respect to FIGS. 19 and 28, and which will not be described again here for brevity sake. After the application of the first and second dielectric layers 348, 350, the device 300 may be annealed to drive oxygen from the second dielectric layer 350 through the first dielectric layer 348 and the barrier layer 346 and into the chemical oxide layer 344 to form a metal layer 352, for example, $TiO_2$, as shown in FIG. 46. The anneal may be, for example, a low temperature anneal as described above with reference to FIG. 20 and which will not be described again here for brevity sake. After annealing the device 300, as shown in FIG. 46, the at least one second opening 342 may include a metal layer 352, a barrier layer 346, a first dielectric layer 348, and a second dielectric layer 350.

Figure 47:
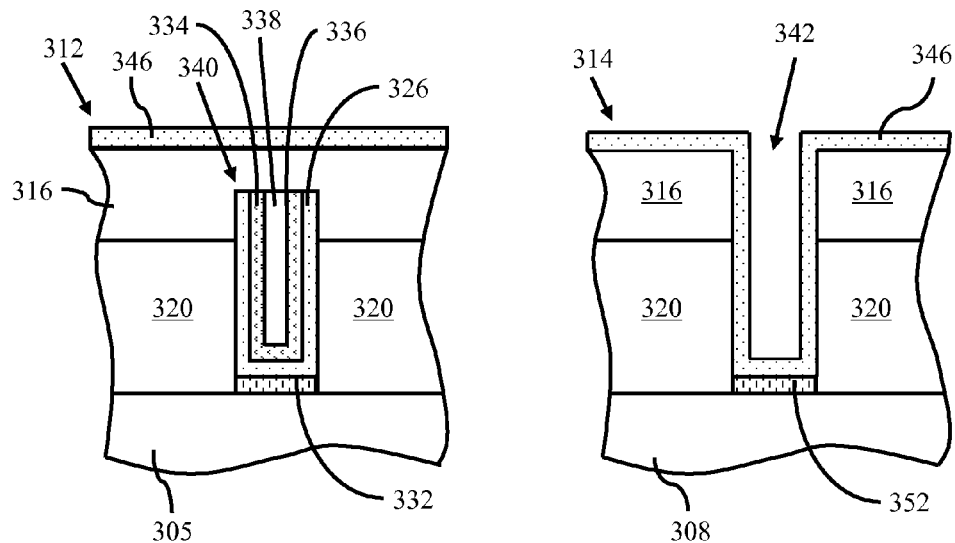
FIG. 47 depicts the structure of FIG. 46 after etching the dielectric layers, in accordance with one or more aspects of the present invention.
Figure 48:
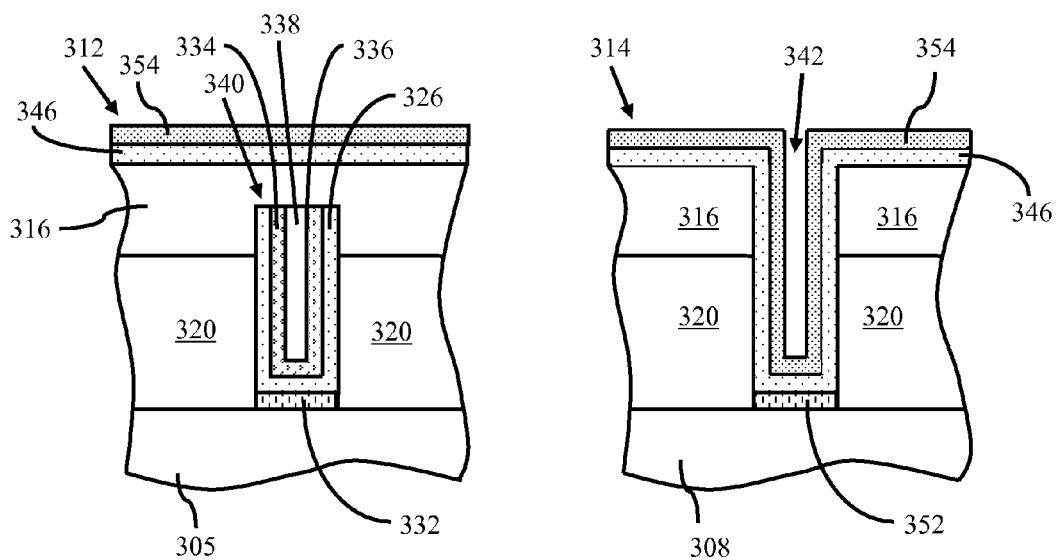
FIG. 48 depicts the structure of FIG. 47 after depositing a third metal layer, in accordance with one or more aspects of the present invention.

Next, etching may be performed to remove the first and second dielectric layers 348, 350 from the at least one second opening 342, down to the barrier layer 346, as shown in FIG. 47. The etching may be, for example, a diluted Hf etch to remove the second dielectric layer 350 and a selective etch, for example, $NH_4OH:H_2O$ or diluted TMAH or $C_4H_{13}NO$ to remove the first dielectric layer 348, as described in greater detail above and which will not be described again here for brevity sake. As shown in FIG. 48, a third metal layer 354 may be deposited onto the device 300 by, for example, PVD. The third metal layer 354 may, for example, line the at least one second opening 342 over the barrier layer 346. The third metal layer 354 may be, for example, an n-metal, such as, Mg, Mn, Hf, Ti, Zr, Ta, Al, Nb, and the like as known by one of ordinary skill in the art. The third metal layer 354 may have a thickness of, for example, approximately 5 nm to approximately 10 nm for a 7 nm to 10 nm device.

Figure 49:
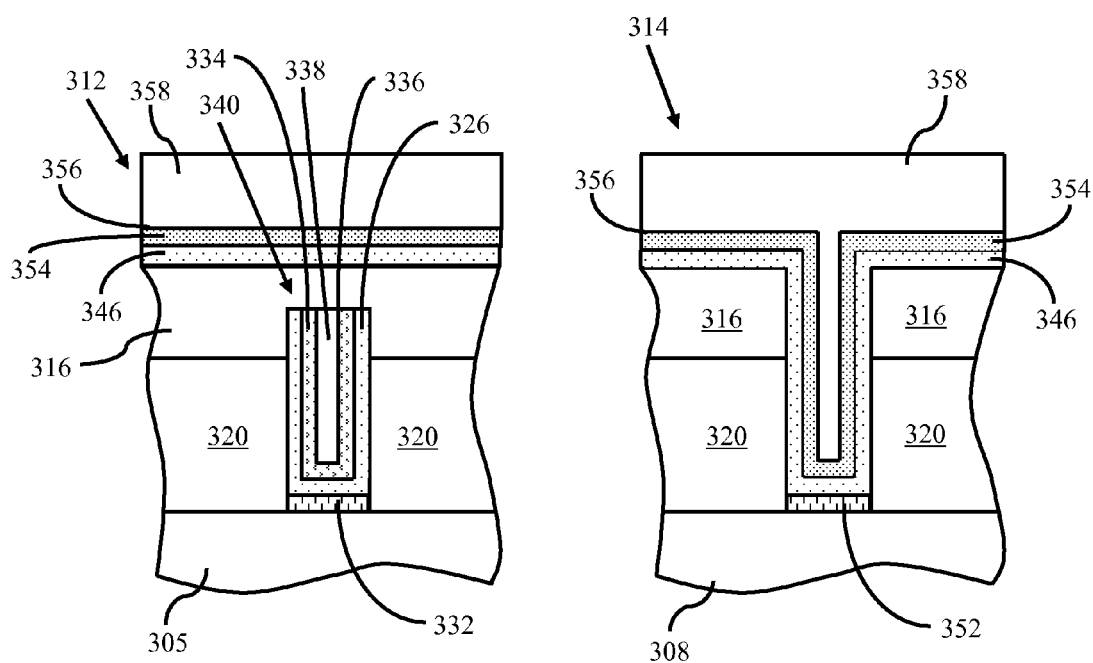
FIG. 49 depicts the structure of FIG. 48 after depositing an adhesion layer and a fourth metal layer, in accordance with one or more aspects of the present invention.
Figure 50:
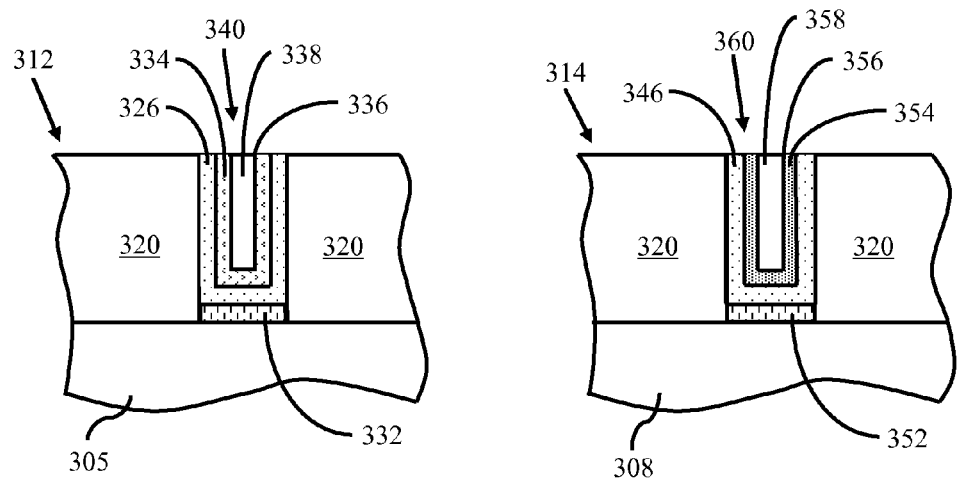
FIG. 50 depicts the structure of FIG. 49 after planarizing the device to remove the stop layer and expose at least one pFET contact and at least one nFET contact, in accordance with one or more aspects of the present invention.

As depicted in FIG. 49, in one embodiment, an adhesion layer 356 may optionally be deposited over the third metal layer 354 and a fourth metal layer 358 may be deposited over the adhesion layer 356. The adhesion layer 356 may be, for example, TiN, and the fourth metal layer 358 may be, for example, a low resistivity metal, such as, W, Co, or another low resistivity metal known by one of ordinary skill in the art. Next, as shown in FIG. 50, a CMP may be performed to remove at least a portion of the fourth metal layer 358, a portion of the adhesion layer 356, a portion of the third metal layer 354, and a portion of the barrier layer 346 to form at least one second contact 360. The at least one second contact 360 may be, for example, at least one n-metal contact. After the contact formation process is complete, the device 300 may include at least one first contact 340 and at least one second contact 360. As described in greater detail above, the at least one first contact 340 may be, for example, a p-metal contact, and the at least one second contact 360 may be, for example, a n-metal contact.

Although only described with examples of 7 nm to 10 nm devices, the above noted fabrications methods and processes may also be used with other size integrated circuit devices. In addition, certain deposition and etching processes are described in the example embodiments, alternative deposition and etching processes as known by one of ordinary skill in the art to obtain the same resultant structure are also contemplated and may replace the above described deposition and etching processes.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    obtaining an intermediate semiconductor device, comprising:
        a substrate; and
        at least one field-effect transistor disposed on the substrate; and
    forming at least one contact on the intermediate semiconductor device, comprising:
        etching at least one opening in the intermediate semiconductor device;
        depositing a chemical oxide into the at least one opening;
        applying at least one barrier layer over the intermediate semiconductor device;
        depositing at least one dielectric layer over the barrier layer; and
        annealing the intermediate semiconductor device.

2. The method of claim 1, wherein forming at least one contact on the intermediate semiconductor device, further comprises:
    forming at least one first contact; and
    forming at least one second contact.

3. The method of claim 2, wherein forming the at least one first contact, comprises:
    applying a photo resist layer over a first portion of the intermediate semiconductor device;
    etching the at least one dielectric layer from a second portion of the intermediate semiconductor device;
    removing the photo resist layer; and
    depositing a first metal over the intermediate semiconductor device; and
    wherein forming the at least one second contact, comprises:
        applying an organic planar layer over the second portion of the intermediate semiconductor device;
        etching the first metal and the at least one dielectric layer from the first portion of the intermediate semiconductor device;
        removing the organic planar layer; and
        depositing a second metal over the intermediate semiconductor device.

4. The method of claim 3, wherein forming the at least one contact on the intermediate semiconductor device, further comprises:
    depositing an adhesion layer over the intermediate semiconductor device;
    depositing a third metal layer over the intermediate semiconductor device; and
    planarizing the intermediate semiconductor device to expose the at least one first contact and the at least one second contact.

5. The method of claim 4, wherein the at least one first contact is a pFET contact and the at least one second contact is an nFET contact.

6. The method of claim 1, wherein forming at least one contact on the intermediate semiconductor device, further comprises:
    depositing a stop layer material over the intermediate semiconductor device prior to etching the at least one opening in the intermediate semiconductor device;
    forming at least one first contact in the at least one opening in a first portion of the intermediate semiconductor device; and
    forming at least one second contact.

7. The method of claim 6, wherein forming at least one first contact comprises:
    etching the at least one dielectric layer from the first portion;
    depositing a first metal layer over the intermediate semiconductor device;
    depositing an adhesion layer over the first metal layer;
    depositing a second metal layer over the adhesion layer; and
    planarizing the intermediate semiconductor device to expose at least one first contact.

8. The method of claim 7, wherein planarizing the intermediate semiconductor device to expose the at least one first contact, comprises:
    removing a portion of the second metal layer, a portion of the adhesion layer, a portion of the first metal layer, a portion of the barrier layer, and a portion of the stop layer material.

9. The method of claim 7, wherein forming at least one second contact comprises:
    depositing additional stop layer material over the intermediate semiconductor device;
    etching at least one second opening in a second portion of the intermediate semiconductor device;
    depositing a chemical oxide into the at least one second opening;

applying at least one barrier layer over the intermediate semiconductor device;
depositing at least one dielectric layer over the barrier layer; and
annealing the intermediate semiconductor device;
etching the at least one dielectric layer from the second portion of the intermediate semiconductor device;
depositing a third metal layer over the intermediate semiconductor device;
depositing an adhesion layer over the third metal layer;
depositing a fourth metal layer over the adhesion layer; and
planarizing the intermediate semiconductor device to expose the at least one first contact and the at least one second contact.

10. The method of claim 9, wherein planarizing the intermediate semiconductor device to expose the at least one first contact and the at least one second contact, comprises:
removing a portion of the fourth metal layer, a portion of the adhesion layer, a portion of the third metal layer, a portion of the barrier layer, and the stop layer material.

11. The method of claim 9, wherein the at least one first contact is a p-metal contact and the at least one second contact is an n-metal contact.

12. The method of claim 9, wherein the at least one first contact is an n-metal contact and the at least one second contact is a p-metal contact.

13. The method of claim 1, wherein the at least one dielectric layer comprises:
a first dielectric layer; and
a second dielectric layer.

14. The method of claim 13, wherein annealing the intermediate semiconductor device comprises:
driving oxygen molecules from the second dielectric layer through the first dielectric layer and the at least one barrier layer into the chemical oxide.

15. The method of claim 14, wherein the second dielectric layer is silicon dioxide, the first dielectric layer is aluminum oxide, the at least one barrier layer is titanium nitride, and the intermediate semiconductor device is annealed at a temperature ranging from approximately 400° C. to 600° C. to drive the oxygen molecules from the silicon dioxide of the second dielectric layer into the chemical oxide to form a titanium dioxide.

* * * * *